(12) United States Patent
Kubo

(10) Patent No.: US 12,402,399 B2
(45) Date of Patent: Aug. 26, 2025

(54) SEMICONDUCTOR DEVICE

(71) Applicant: ROHM CO., LTD., Kyoto (JP)

(72) Inventor: Yusuke Kubo, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 18/303,257

(22) Filed: Apr. 19, 2023

(65) Prior Publication Data

US 2023/0260989 A1 Aug. 17, 2023

Related U.S. Application Data

(63) Continuation of application No. 17/040,420, filed as application No. PCT/JP2019/014340 on Mar. 29, 2019, now Pat. No. 11,664,369.

(30) Foreign Application Priority Data

Mar. 29, 2018 (JP) ................................ 2018-064795

(51) Int. Cl.
*H10D 84/80* (2025.01)
*H03K 17/042* (2006.01)
(Continued)

(52) U.S. Cl.
CPC ..... *H10D 84/811* (2025.01); *H03K 17/04206* (2013.01); *H03K 17/165* (2013.01);
(Continued)

(58) Field of Classification Search
CPC ............. H01L 27/0629; H01L 29/0696; H01L 29/7804–7805; H01L 29/66712–66734;
(Continued)

(56) References Cited

U.S. PATENT DOCUMENTS

2008/0290407 A1 11/2008 Kusunoki et al.
2015/0001579 A1* 1/2015 Nishimura ........... H10D 84/141
438/237
(Continued)

FOREIGN PATENT DOCUMENTS

JP 2003197914 A 7/2003
JP 2008294301 A 12/2008
(Continued)

OTHER PUBLICATIONS

International Search Report and Written Opinion issued for International Patent Application No. PCT/JP2019/014340, Date of mailing: May 28, 2019, 9 pages including English translation of Search Report.

(Continued)

*Primary Examiner* — Wael M Fahmy
*Assistant Examiner* — Quinton A Brasfield
(74) *Attorney, Agent, or Firm* — XSENSUS LLP

(57) ABSTRACT

A semiconductor device includes a semiconductor layer, a first conductor disposed on the semiconductor layer, a second conductor disposed on the semiconductor layer so as to be separated from the first conductor, a relay portion that is formed on the semiconductor layer so as to straddle the first conductor and the second conductor and that is made of a semiconductor having a first conductivity type region and a second conductivity type region, a first contact by which the first conductivity type region and the second conductivity type region are electrically connected to the first conductor, and a second contact that electrically connects the first conductivity type region of the relay portion and the second conductor together and that is insulated from the second conductivity type region.

17 Claims, 23 Drawing Sheets

(51) Int. Cl.
  *H03K 17/16* (2006.01)
  *H10D 30/66* (2025.01)
  *H10D 62/10* (2025.01)
  *H10D 84/00* (2025.01)

(52) U.S. Cl.
  CPC .......... *H10D 30/66* (2025.01); *H10D 62/127* (2025.01); *H10D 84/143* (2025.01)

(58) Field of Classification Search
  CPC .... H01L 29/7802–7815; H10D 84/141; H10D 84/143; H10D 62/109–111
  See application file for complete search history.

(56) References Cited

U.S. PATENT DOCUMENTS

| | | | |
|---|---|---|---|
| 2015/0041816 A1* | 2/2015 | Wood | H10D 62/127 438/270 |
| 2015/0325558 A1 | 11/2015 | Hikasa | |
| 2017/0062412 A1 | 3/2017 | Kawano et al. | |
| 2017/0110545 A1 | 4/2017 | Nagao et al. | |
| 2017/0229572 A1 | 8/2017 | Nagase et al. | |
| 2017/0338336 A1* | 11/2017 | Nasu | H10D 64/257 |
| 2017/0373583 A1 | 12/2017 | Nakajima et al. | |
| 2018/0096991 A1* | 4/2018 | Nasu | H10D 84/811 |
| 2018/0286975 A1* | 10/2018 | Hatakenaka | H10D 30/0297 |

FOREIGN PATENT DOCUMENTS

| | | |
|---|---|---|
| JP | 2015220334 A | 12/2015 |
| JP | 2015233133 A | 12/2015 |
| JP | 2017045797 A | 3/2017 |
| JP | 2017143188 A | 8/2017 |
| JP | 2018007539 A | 1/2018 |

OTHER PUBLICATIONS

International Preliminary Report on Patentability issued for International Patent Application No. PCT/JP2019/014340, Date of mailing: Oct. 8, 2020, 12 pages including English translation.

* cited by examiner

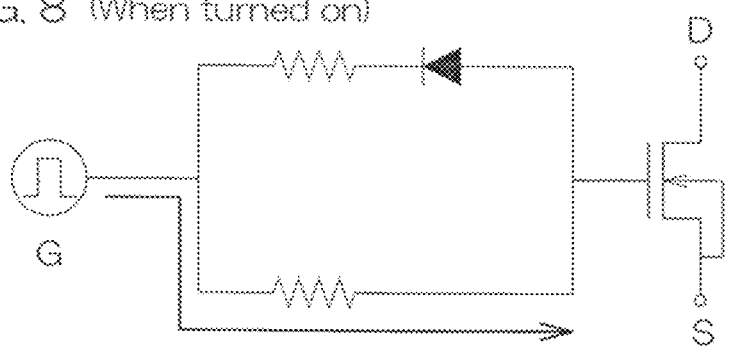
FIG. 8 (When turned on)
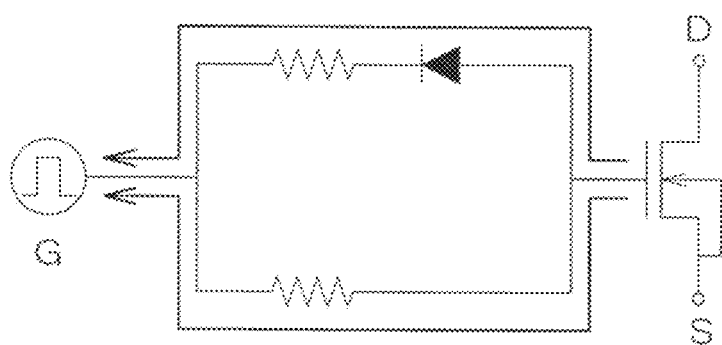
FIG. 9 (When turned off)

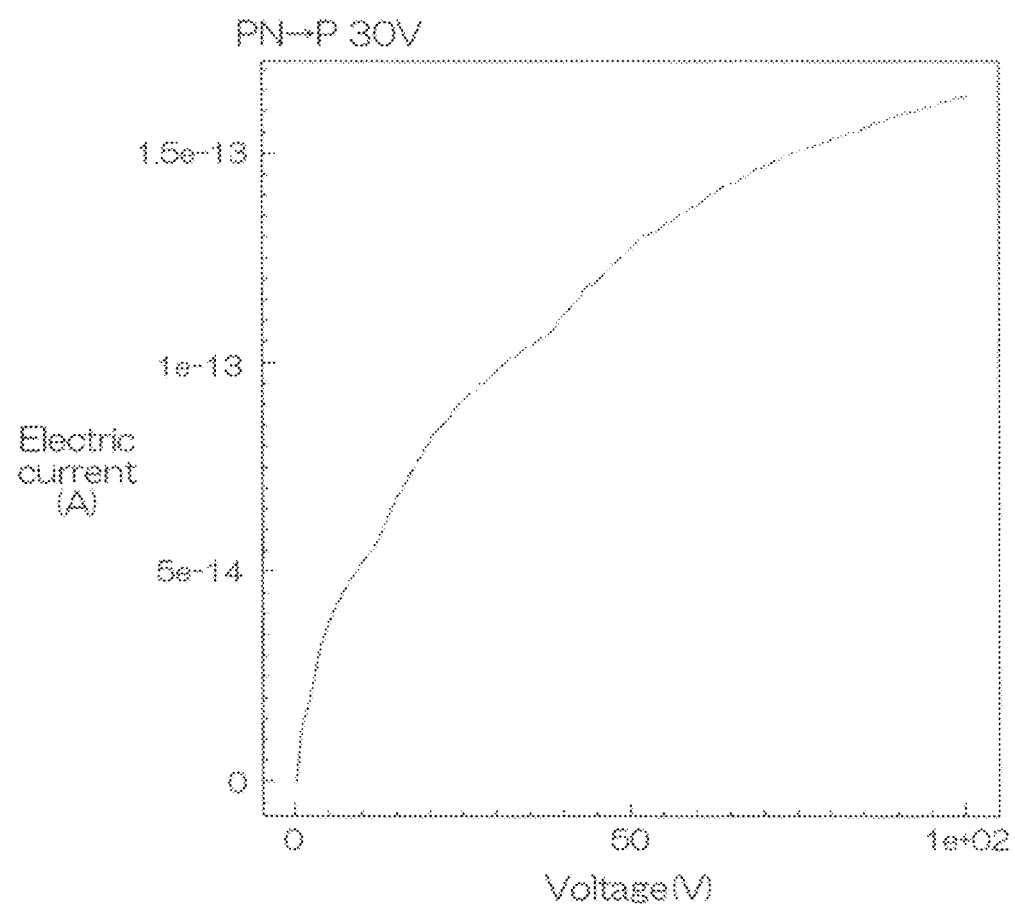

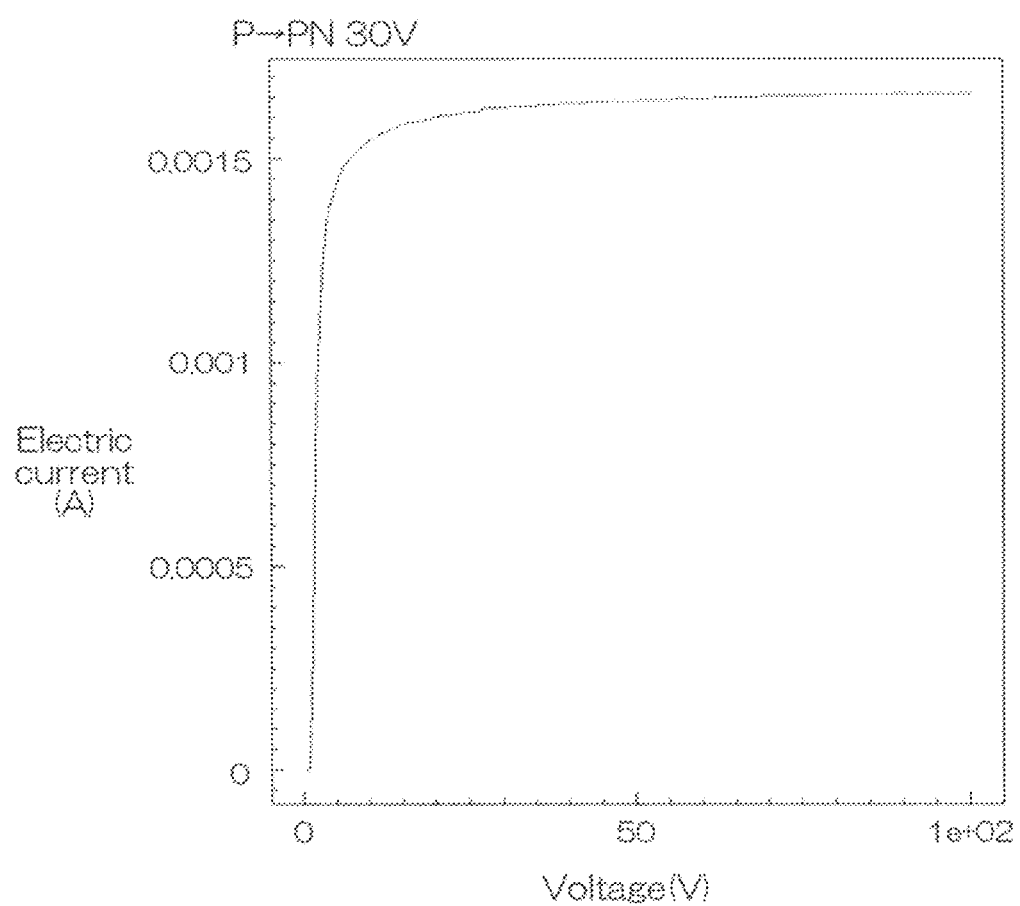

FIG. 16 (Pattern A)
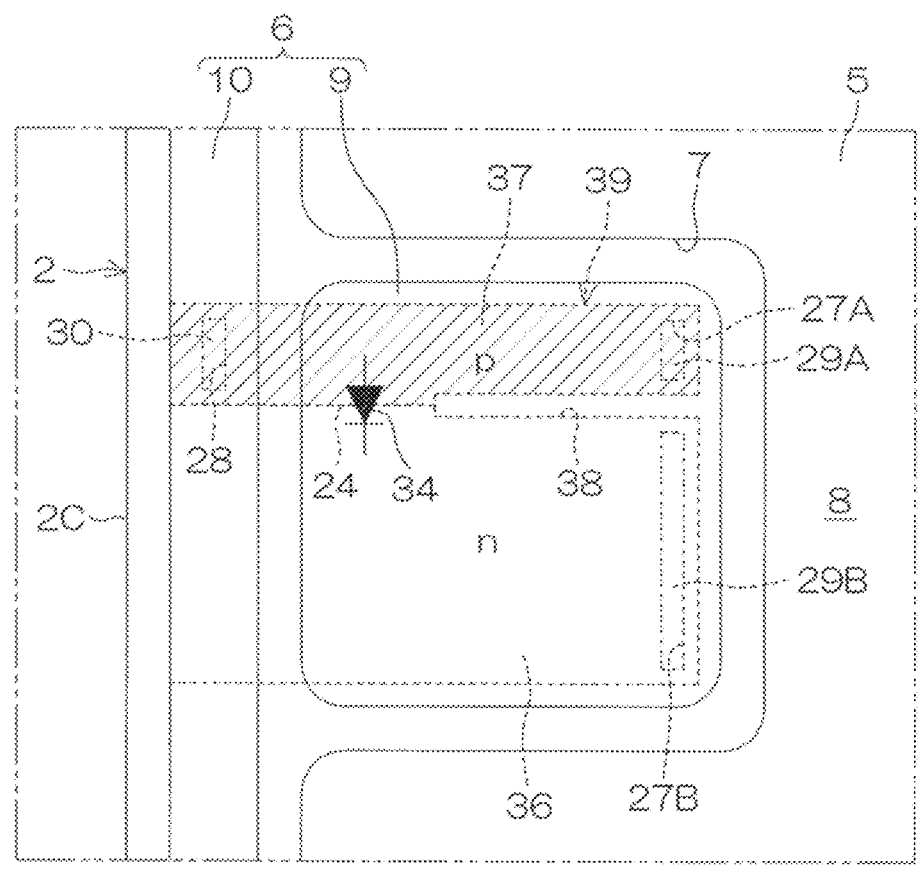

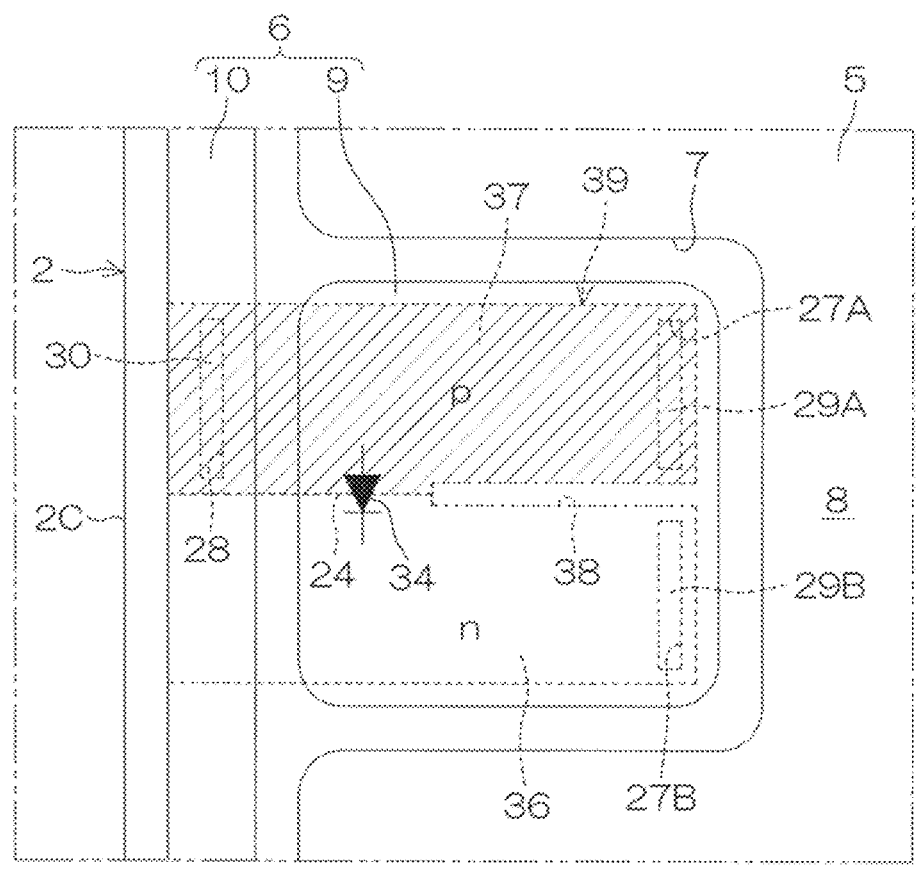
FIG. 17 (Pattern B)

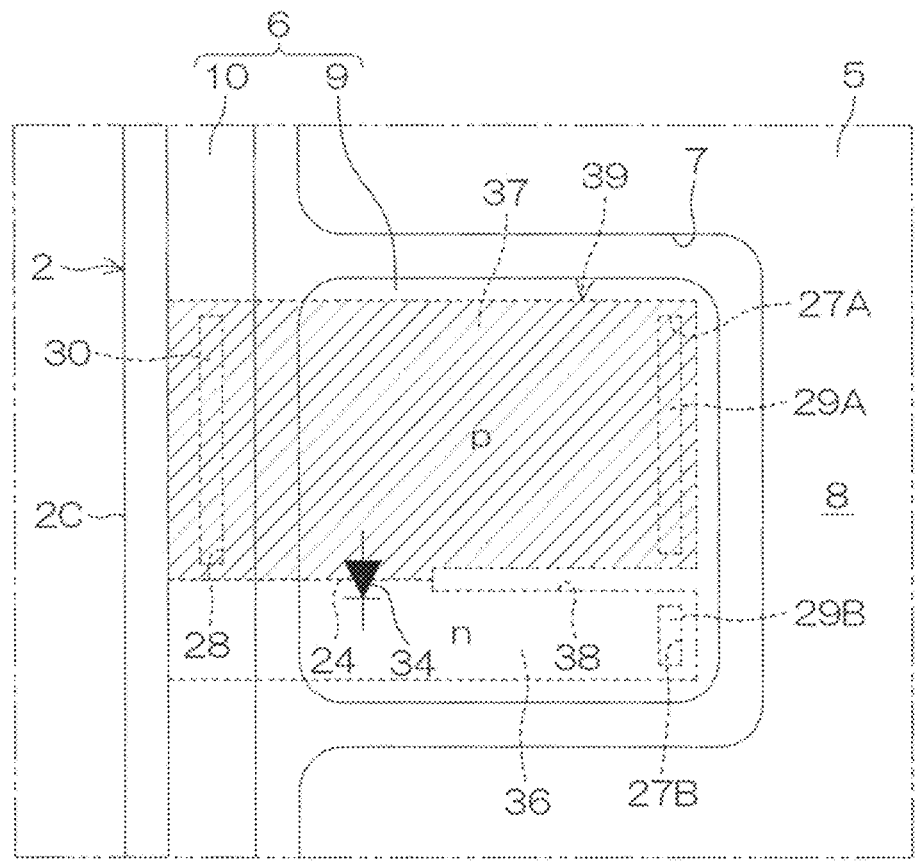
FIG. 18 (Pattern C)

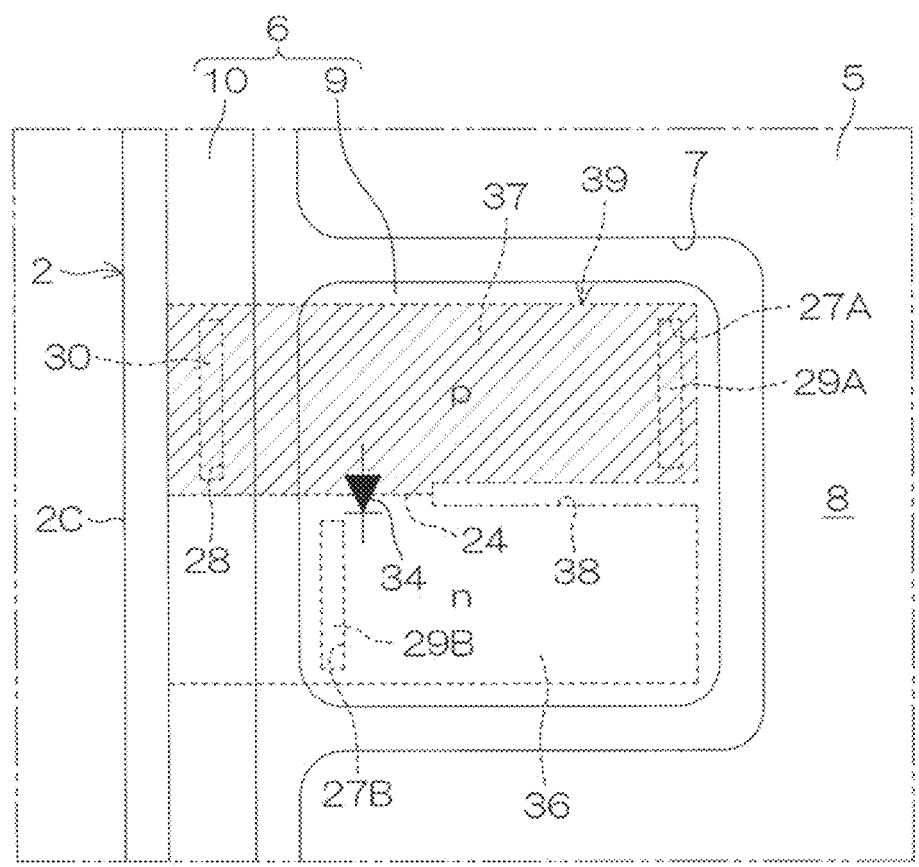
FIG. 19 (Pattern D)

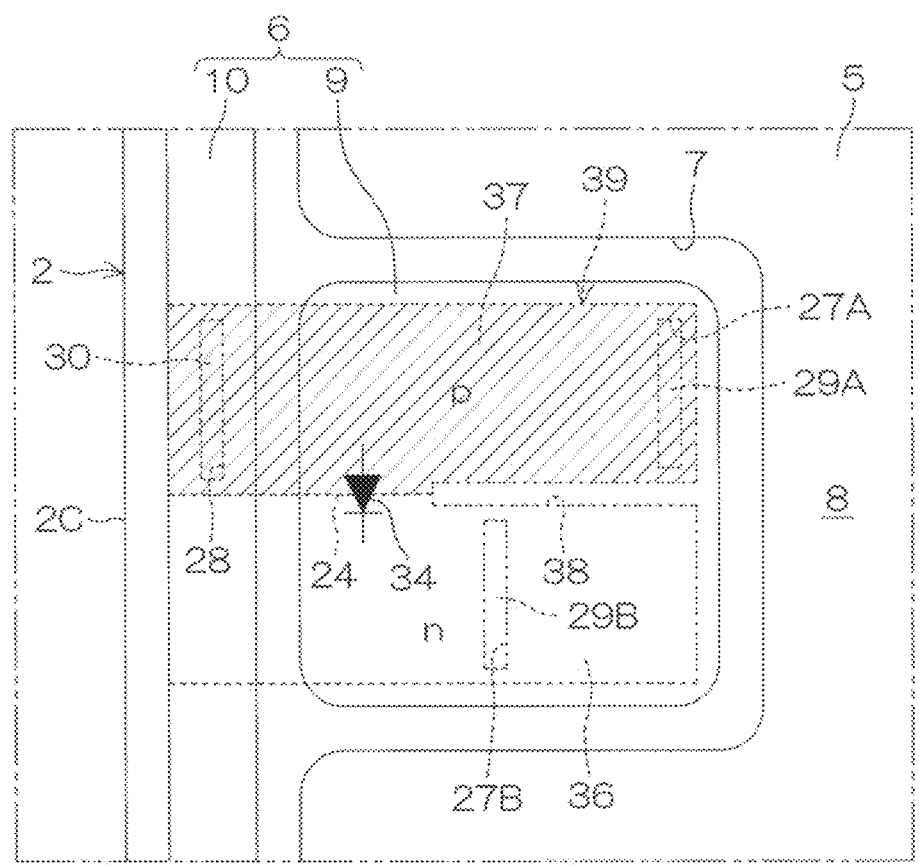
FIG. 20 (Pattern E)

FIG. 21 (Pattern F)
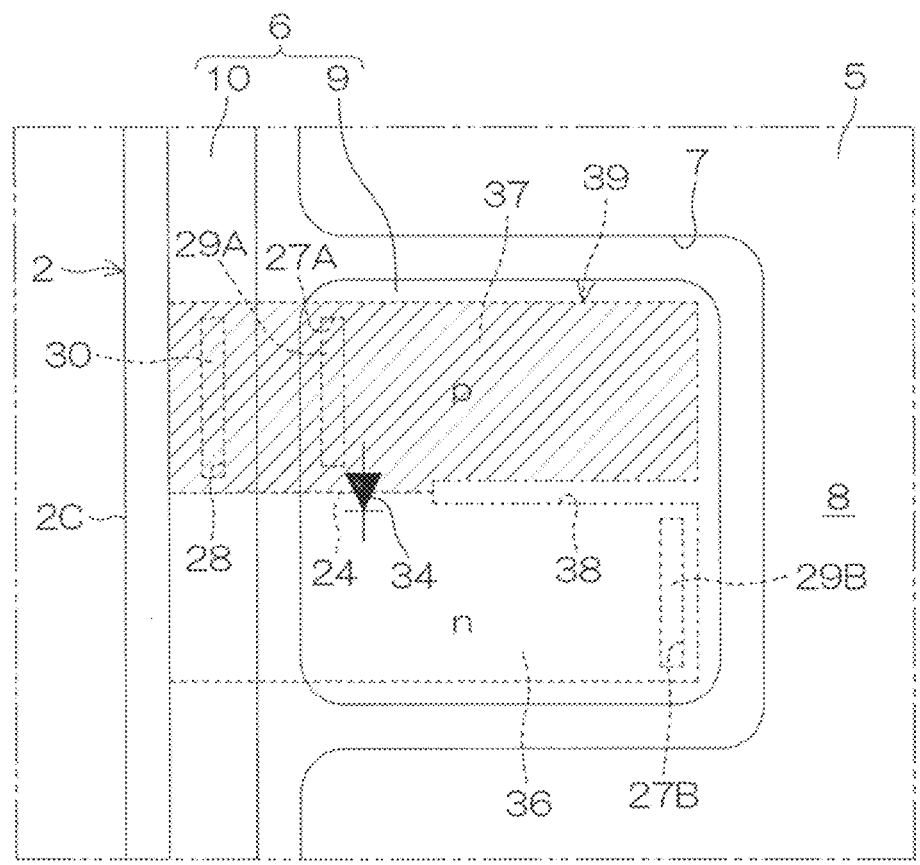

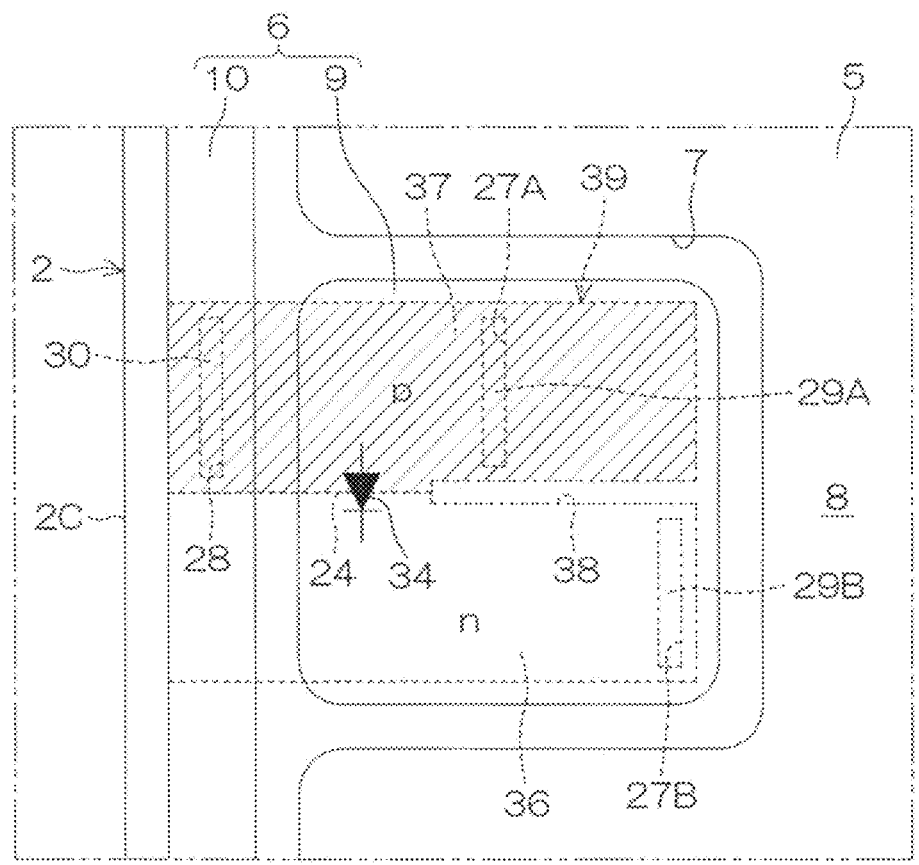
FIG. 22 (Pattern G)

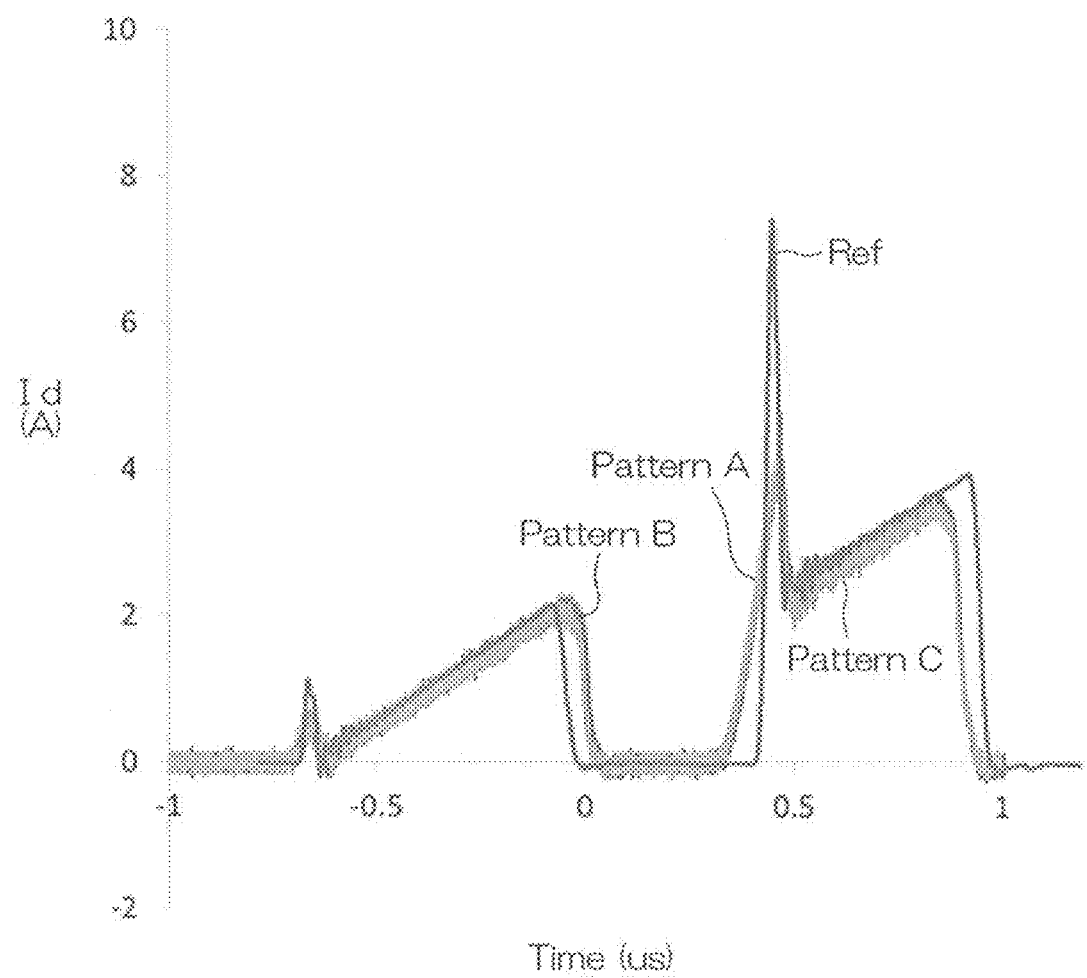

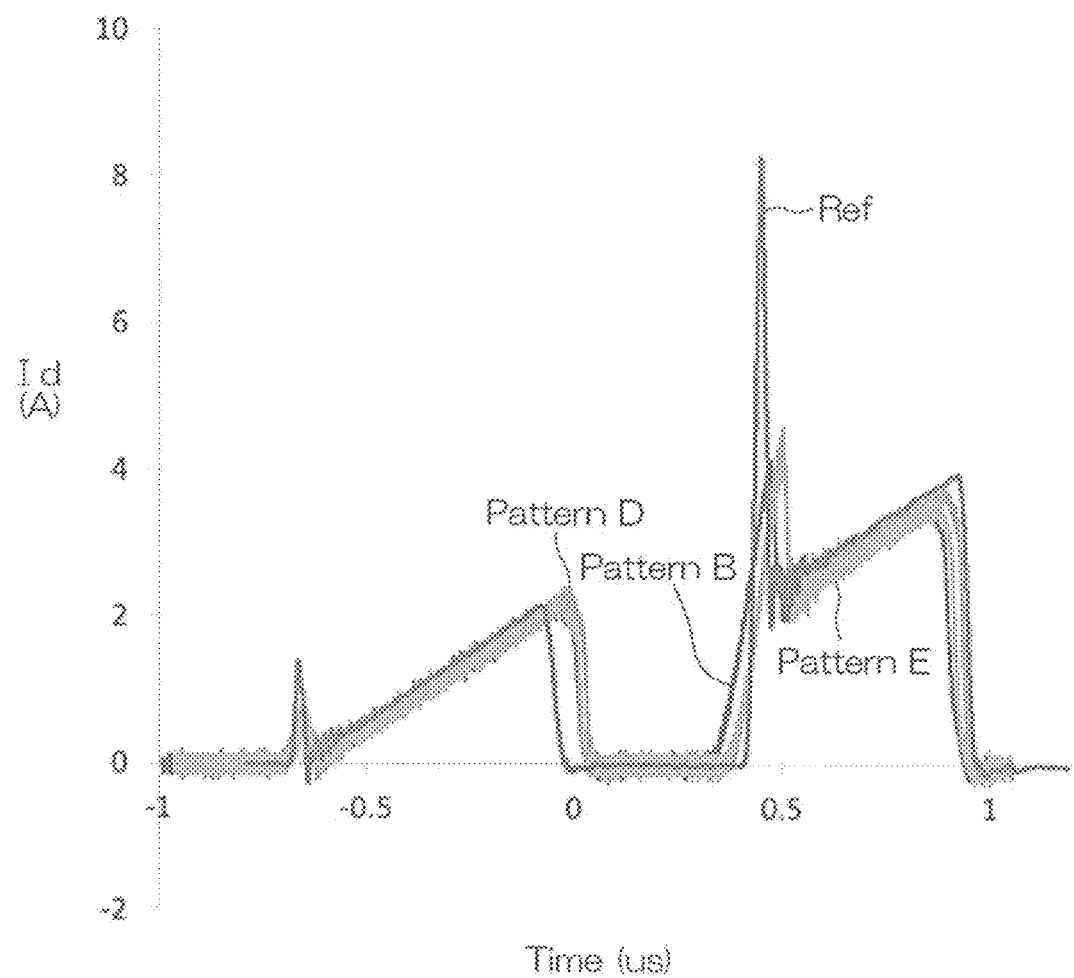

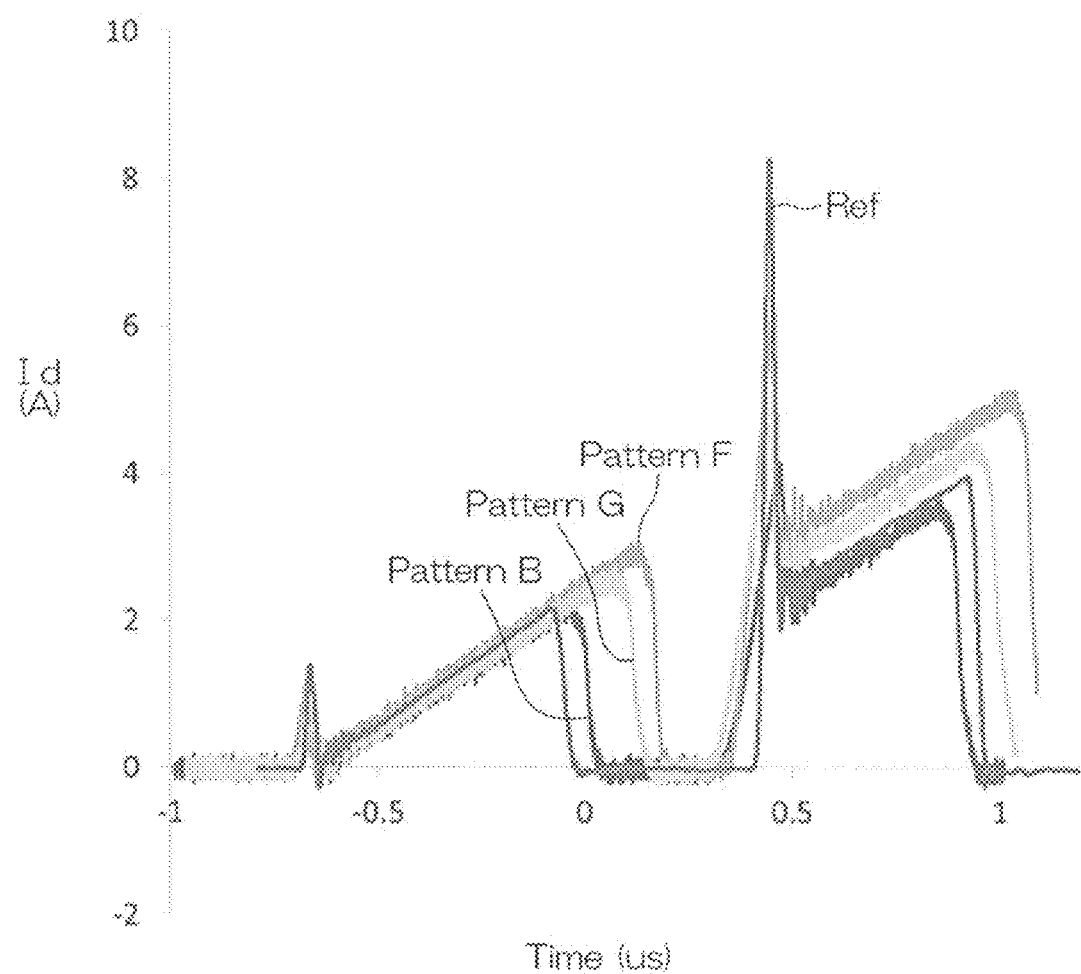

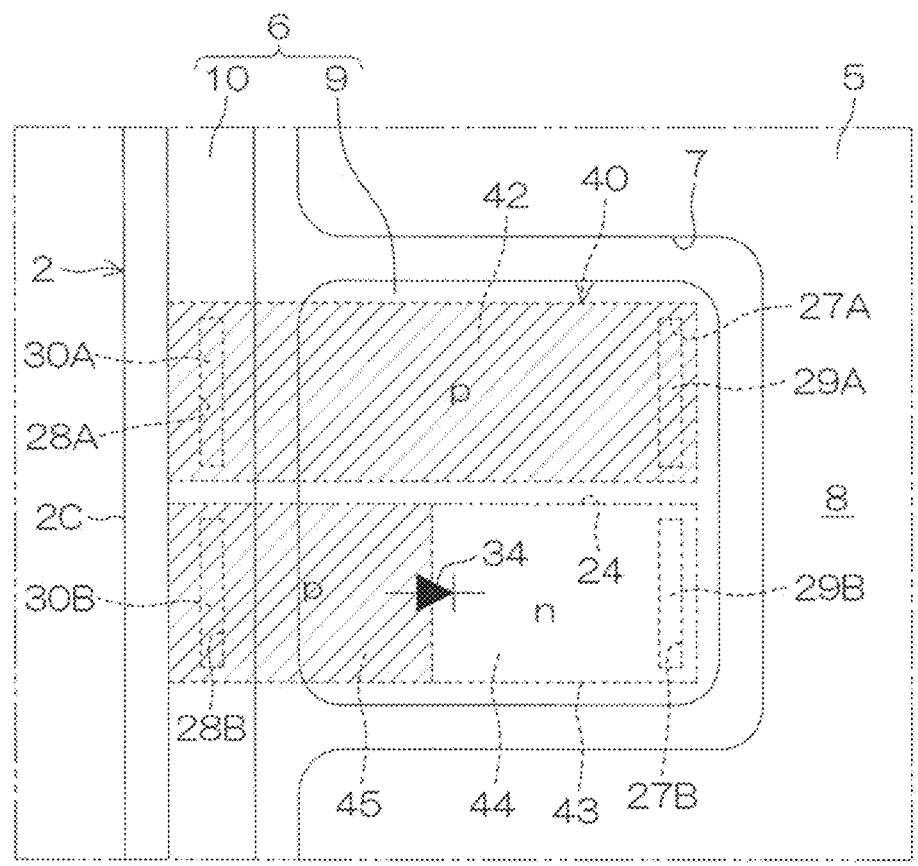
FIG. 26 (Pattern H)

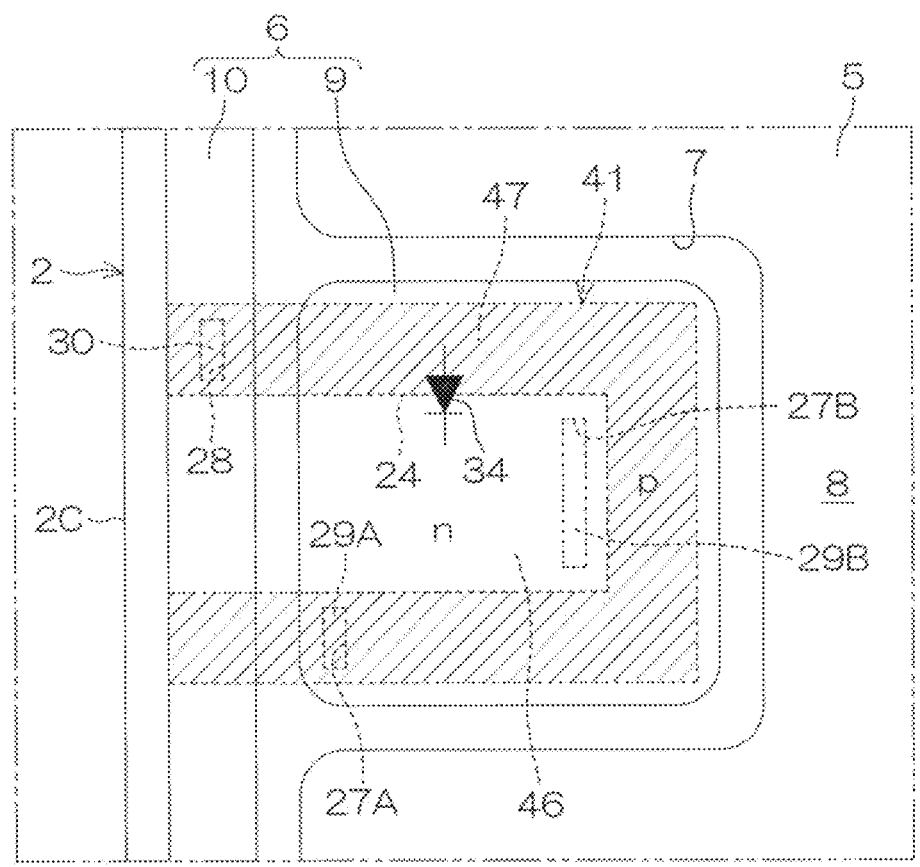
FIG. 27 (Pattern I)

SEMICONDUCTOR DEVICE

TECHNICAL FIELD

The present invention relates to a semiconductor device.

BACKGROUND ART

Patent Literature 1 discloses a semiconductor device which includes a semiconductor substrate, a first conductivity type drift layer formed at the semiconductor substrate, a second conductivity type body region and a first conductivity type source region that are formed at the drift layer, a gate insulating film disposed on a part of the body region sandwiched between the drift layer and the source region, a gate electrode disposed so as to face the part of the body region sandwiched between the drift layer and the source region with the gate insulating film between the gate electrode and the part of the body region, a source electrode disposed on the semiconductor substrate, and a gate pad that is formed on the semiconductor substrate and that is electrically connected to the gate electrode through a gate wiring.

CITATION LIST

Patent Literature

Patent Literature 1: Japanese Patent Application Publication No. 2017-143188

SUMMARY OF INVENTION

Technical Problem

In controlling the voltage of the semiconductor device, the amount of noise caused by ringing when the voltage is turned on and the amount of noise caused by ringing when the voltage is turned off are never completely equal to each other, and there is a case in which only the noise caused when the voltage is turned on is intended to be reduced or only the noise caused when the voltage is turned off is intended to be reduced.

For example, referring to Patent Literature 1, when a voltage is applied from the gate pad to the gate electrode, ringing easily occurs when the voltage is turned on, whereas ringing does not easily occur when the voltage is turned off, and therefore it is preferable to reduce only the noise produced when the voltage is turned on.

Therefore, it is considered that a circuit in which a pair of resistors connected in parallel with each other and in which a diode is connected to only one of the resistors in series is disposed outside the semiconductor device. Hence, when a forward current of the diode flows to the parallel circuit, the current flows through both of a pair of current paths, and therefore it is possible to make resistance smaller, whereas when a reverse current of the diode flows thereto, the current flows through only one (to which the diode is not connected) of the pair of current paths, and therefore it is possible to make resistance larger. Therefore, it is expected that the aforementioned problem of reducing only the noise caused when the voltage is turned on or only the noise caused when the voltage is turned off will be solved by selectively increasing resistance when ringing easily occurs.

However, at least one chip is required besides the semiconductor device, and the space efficiency is forced to be reduced when the semiconductor device is mounted.

An object of the present invention is to provide a semiconductor device that is capable of performing control so that resistances become different from each other between a case in which an electric current flows in a direction from a first conductor toward a second conductor and a case in which an electric current flows in a direction opposite thereto while maintaining the space efficiency when the semiconductor device is mounted.

Another object of the present invention is to provide a semiconductor device that is capable of appropriately controlling the behavior of a gate current when a functional element is turned on/off while maintaining the space efficiency when the semiconductor device is mounted.

Solution to Problem

A semiconductor device according to one preferred embodiment of the present invention includes a semiconductor layer, a first conductor disposed on the semiconductor layer, a second conductor disposed on the semiconductor layer so as to be separated from the first conductor, a relay portion that is formed on the semiconductor layer so as to straddle the first conductor and the second conductor and that is made of a semiconductor having a first conductivity type region and a second conductivity type region, a first contact by which the first conductivity type region and the second conductivity type region are electrically connected to the first conductor, and a second contact that electrically connects the first conductivity type region of the relay portion and the second conductor together and that is insulated from the second conductivity type region.

For example, if the first conductivity type is a p type and if the second conductivity type is an n type, the first conductor is connected to both the p type region and the n type region through the first contact, and the second conductor is connected to only the p type region through the second contact.

When a positive voltage with respect to the second conductor is applied to the first conductor, the flow of an electric current between the first conductor and the second conductor takes a direction from the first conductor toward the second conductor. In this case, a reverse current will flow to a pn junction between the first conductivity type region (p type region) and the second conductor type region (n type region). Therefore, the current path is limited to the path of (1) the first conductor→the first contact→the first conductivity type region (p type region)→the second contact→the second conductor, and an electric current does not flow or hardly flows to the path of (2) the first conductor→the first contact→the second conductivity type region (n type region)→the pn junction→the first conductivity type region (p type region)→the second contact→the second conductor.

On the other hand, when a positive voltage with respect to the first conductor is applied to the second conductor, the flow of an electric current between the first conductor and the second conductor takes a direction from the second conductor toward the first conductor. In this case, a forward current will flow to the pn junction between the first conductivity type region (p type region) and the second conductor type region (n type region). Therefore, it is possible to use two paths in total as current paths, i.e., it is possible to use the path of (3) the second conductor→the second contact→the first conductivity type region (p type region)→the first contact→the first conductor and the path of (4) the second conductor→the second contact→the first conductivity type region (p type region)→the pn junction→the second conductivity type region (n type region) the first contact→the first conductor.

In other words, in the former case, the number of current paths is one, hence making it possible to relatively heighten resistance, and in the latter case, the number of current paths is two, hence making it possible to relatively make resistance lower than that in the former case. If the first conductivity type is an n type and if the second conductivity type is a p type, the number of current paths is two when a positive voltage with respect to the second conductor is applied to the first conductor, and the number of current paths is one when a positive voltage with respect to the first conductor is applied to the second conductor.

As thus described, the number of current paths can be changed according to the positive/negative direction of a voltage, and therefore it is possible to make resistances different from each other between a case in which an electric current flows in a direction from the first conductor toward the second conductor and a case in which an electric current flows in a direction opposite thereto. Moreover, it is possible to perform such current control inside the semiconductor device, and therefore it is also possible to maintain the space efficiency when the semiconductor device is mounted.

The semiconductor device according to one preferred embodiment of the present invention may further include a functional element formed at the semiconductor layer, and, in the semiconductor device, the first conductor may include an external terminal to which electric power is supplied from outside, and the second conductor may include a wiring that supplies electric power supplied to the first conductor to the functional element.

In the semiconductor device according to one preferred embodiment of the present invention, the functional element may be an element including a gate electrode that controls an electric current that flows to the functional element, and the external terminal may include a gate pad to which an electroconductive bonding member is bonded from outside, and the wiring may include a gate wiring that supplies electric power supplied to the gate pad to the gate electrode, and the first conductivity type region may be a p type region, and the second conductivity type region may be an n type region.

According to this arrangement, the number of paths of gate current that flows when the functional element is turned on differs from the number of paths of gate current that flows when the functional element is turned off, and resistance when the functional element is turned on differs from resistance when the functional element is turned off. Therefore, it is possible to appropriately control the behavior of a gate current when the functional element is turned on/off.

In the semiconductor device according to one preferred embodiment of the present invention, the gate wiring may include a gate finger disposed at an outer peripheral portion of the semiconductor layer so as to surround the functional element.

In the semiconductor device according to one preferred embodiment of the present invention, the relay portion may be disposed closer to the semiconductor layer than the gate pad and the gate wiring, and the first conductivity type region and the second conductivity type region may each extend from a region below the gate pad to a region below the gate wiring so that a boundary portion between the first conductivity type region and the second conductivity type region intersects the gate pad and the gate wiring.

In the semiconductor device according to one preferred embodiment of the present invention, the functional element may include a field-effect transistor that has a body region selectively formed at a surface portion of the semiconductor layer, a source region formed at an inner portion of the body region, and the gate electrode facing a part of the body region through a gate insulating film.

In the semiconductor device according to one preferred embodiment of the present invention, the body region may include a plurality of body regions that extend in a striped manner with intervals from each other.

In the semiconductor device according to one preferred embodiment of the present invention, the relay portion may include a second conductivity type layer as the second conductivity type region and the first conductivity type region selectively formed at a surface portion of the second conductivity type layer.

In the semiconductor device according to one preferred embodiment of the present invention, a thickness of the second conductivity type layer may be 0.1 μm to 10 μm, and a depth of the first conductivity type region from a surface of the second conductivity type layer may be 0.1 μm to 10 μm.

In the semiconductor device according to one preferred embodiment of the present invention, the relay portion may include a second conductivity type layer as the second conductivity type region and a first conductivity type layer as the first conductivity type region, the first conductivity type layer adjoining the second conductivity type layer and being contiguous to the second conductivity type layer.

The semiconductor device according to one preferred embodiment of the present invention may further include a slit that is formed on an extension line of a boundary portion between the second conductivity type layer and the first conductivity type layer and by which the second conductivity type layer and the first conductivity type layer are partially separated from each other.

In the semiconductor device according to one preferred embodiment of the present invention, the first contact may be formed so as to straddle the first conductivity type region and the second conductivity type region of the relay portion.

In the semiconductor device according to one preferred embodiment of the present invention, the first contact may include a one-side first contact that is connected to the first conductivity type region of the relay portion and an opposite-side first contact that is apart from the one-side first contact and that is connected to the second conductivity type region of the relay portion.

In the semiconductor device according to one preferred embodiment of the present invention, an impurity concentration of the first conductivity type region may be $1.0 \times 10^{19}$ $cm^{-3}$ to $1.0 \times 10^{21}$ $cm^{-3}$, and an impurity concentration of the second conductivity type region may be $1.0 \times 10^{19}$ $cm^{-3}$ to $1.0 \times 10^{21}$ $cm^{-3}$.

In the semiconductor device according to one preferred embodiment of the present invention, the first conductor and the second conductor may each be made of aluminum, and the relay portion may be made of polysilicon.

In the semiconductor device according to one preferred embodiment of the present invention, the semiconductor layer may include a silicon substrate.

BRIEF DESCRIPTION OF DRAWINGS

FIG. 8 is a view showing an equivalent circuit (when turned on) of a gate electrode of the semiconductor device.

FIG. 9 is a view showing the equivalent circuit (when turned off) of the gate electrode of the semiconductor device.

FIG. 10 is a diagram showing I-V characteristics (when turned on) of the gate electrode of the semiconductor device.

FIG. 11 is diagram showing I-V characteristics (when turned off) of the gate electrode of the semiconductor device.

FIG. 16 is a schematic plan view showing a structure of a portion below a gate pad of Example 1.

FIG. 17 is a schematic plan view showing a structure of a portion below a gate pad of Example 2.

FIG. 18 is a schematic plan view showing a structure of a portion below a gate pad of Example 3.

FIG. 19 is a schematic plan view showing a structure of a portion below a gate pad of Example 4.

FIG. 20 is a schematic plan view showing a structure of a portion below a gate pad of Example 5.

FIG. 21 is a schematic plan view showing a structure of a portion below a gate pad of Example 6.

FIG. 22 is a schematic plan view showing a structure of a portion below a gate pad of Example 7.

FIG. 23 is a view showing a time-dependent change of an electric current when the gate voltage is turned on/off with respect to Examples 1 to 3.

FIG. 24 is a view showing a time-dependent change of an electric current when the gate voltage is turned on/off with respect to Examples 2, 4, and 5.

FIG. 25 is a view showing a time-dependent change of an electric current when the gate voltage is turned on/off with respect to Examples 2, 6, and 7.

FIG. 26 is a schematic plan view showing a structure of a portion below a gate pad of Example 8.

FIG. 27 is a schematic plan view showing a structure of a portion below a gate pad of Example 9.

DESCRIPTION OF EMBODIMENTS

Preferred embodiments of the present invention will be hereinafter described in detail with reference to the accompanying drawings.

Figure 1:
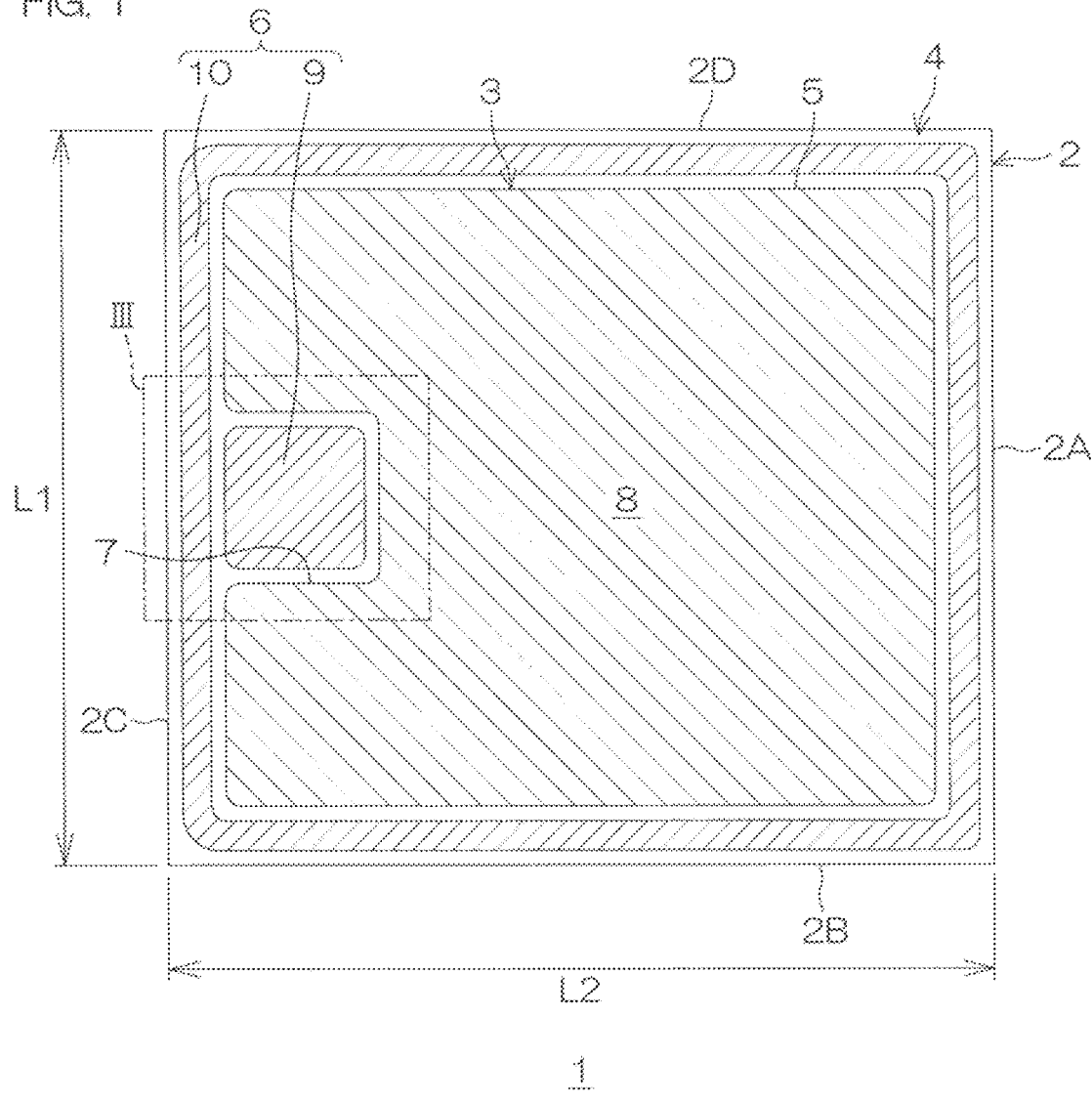
FIG. 1 is a schematic plan view of a semiconductor device according to a preferred embodiment of the present invention.

FIG. 1 is a schematic plan view of a semiconductor device 1 according to a preferred embodiment of the present invention. For clarity, electrode films 5 and 6 are hatched as shown in FIG. 1.

The semiconductor device 1 includes a semiconductor substrate 2 that is an example of a semiconductor layer of the present invention and that is formed in a quadrangular shape in a plan view. A length L1 (i.e., length along lateral surfaces 2A and 2C of the semiconductor substrate 2 in FIG. 1) in a first direction of the semiconductor substrate 2 may be, for example, 1.0 mm to 9.0 mm, and a length L2 (i.e., length along lateral surfaces 2B and 2D of the semiconductor substrate 2 in FIG. 1) in a second direction perpendicular to the first direction may be, for example, 1.0 mm to 9.0 mm.

The semiconductor substrate 2 includes an active portion 3 in its central region in a plan view. The active portion 3 is a region in which a unit cell 19 described later is chiefly formed, and is a region in which an electric current flows in a thickness direction of the semiconductor substrate 2 when a source-to-drain space of the semiconductor device 1 is in an electrically conductive state (i.e., when turned on). The semiconductor substrate 2 additionally includes an outer peripheral portion 4 around the active portion 3.

The semiconductor device 1 includes a source electrode film 5 and a gate electrode film 6. These electrode films 5 and 6 are formed so as to be separated from each other by patterning of a common electrode film.

The source electrode film 5 is formed in a substantially quadrangular shape in a plan view with which most of the active portion 3 is covered. A concave portion 7 that is concaved toward an inward side of the source electrode film 5 is formed at one lateral portion of the source electrode film 5 (i.e., lateral portion along the lateral surface 2C of the semiconductor substrate 2 in FIG. 1). The concave portion 7 is provided to effectively secure an arrangement space for a first conductive film 9 described later. The source electrode film 5 is selectively covered with a surface insulating film 31 (see FIG. 5 and FIG. 6), and a part of the source electrode film 5 is exposed as a source pad 8. A joining member, such as a bonding wire, is connected to the source pad 8.

The gate electrode film 6 includes the first conductive film 9 that is an example of a first conductor of the present invention and a second conductive film 10 that is an example of a second conductor of the present invention.

Figure 5:
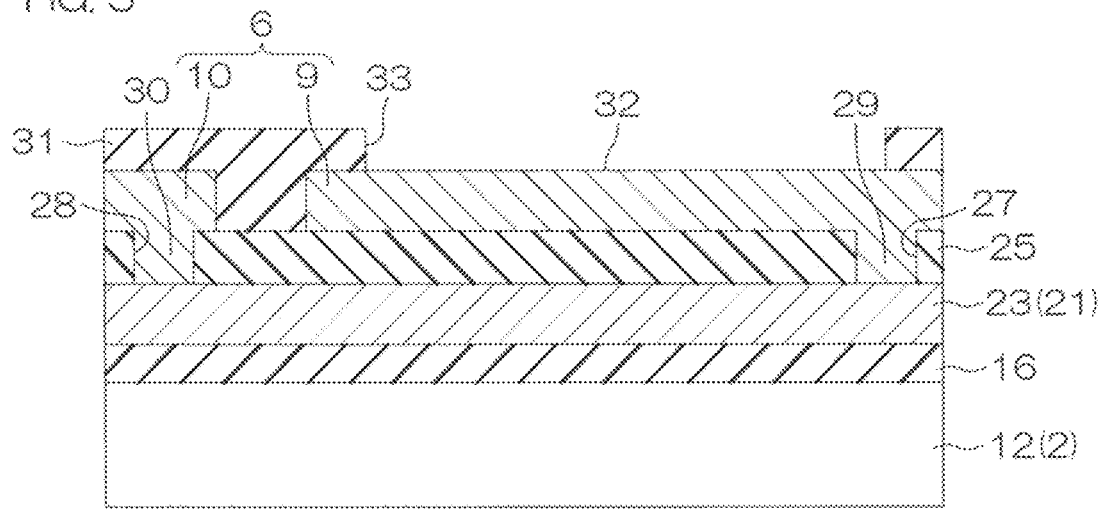
FIG. 5 is a cross-sectional view showing a cross section taken along line V-V of FIG. 3.
Figure 6:
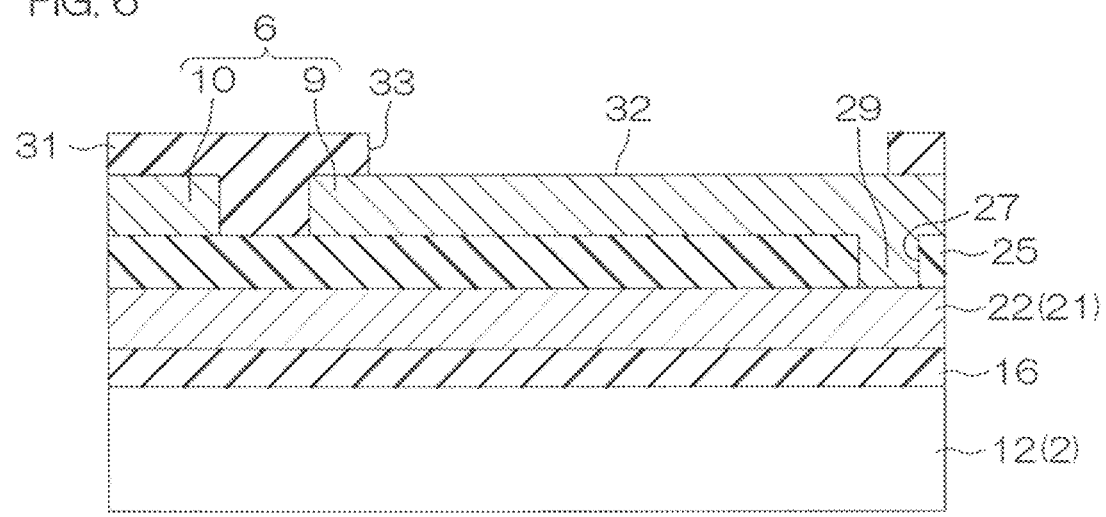
FIG. 6 is a cross-sectional view showing a cross section taken along line VI-VI of FIG. 3.

The first conductive film 9 includes a part, which is selectively exposed from the surface insulating film 31, of the gate electrode film 6 covered with the surface insulating film 31 (see FIG. 5 and FIG. 6). A joining member, such as a bonding wire, is connected to the first conductive film 9. In other words, the first conductive film 9 functions as an external terminal on the gate side in the semiconductor device 1. The first conductive film 9 is disposed in an inward region of the concave portion 7 of the source electrode film 5 in a plan view.

The second conductive film 10 is formed in a linear shape along the lateral surfaces 2A to 2D of the semiconductor substrate 2 from the first conductive film 9. In the present preferred embodiment, the second conductive film 10 is formed in a closed annular shape that surrounds the source electrode film 5. The second conductive film 10 functions as a gate wiring (gate finger) that supplies electric power supplied to the first conductive film 9 to a gate electrode 17 described later. The second conductive film 10 is not necessarily required to have the closed annular shape, and may be formed in a partially-opened shape. The second conductive film 10 may be formed in, for example, a shape that is opened on the side opposite to the first conductive film 9. Additionally, the second conductive film 10 is covered with the surface insulating film 31 (see FIG. 5 and FIG. 6).

Figure 2:
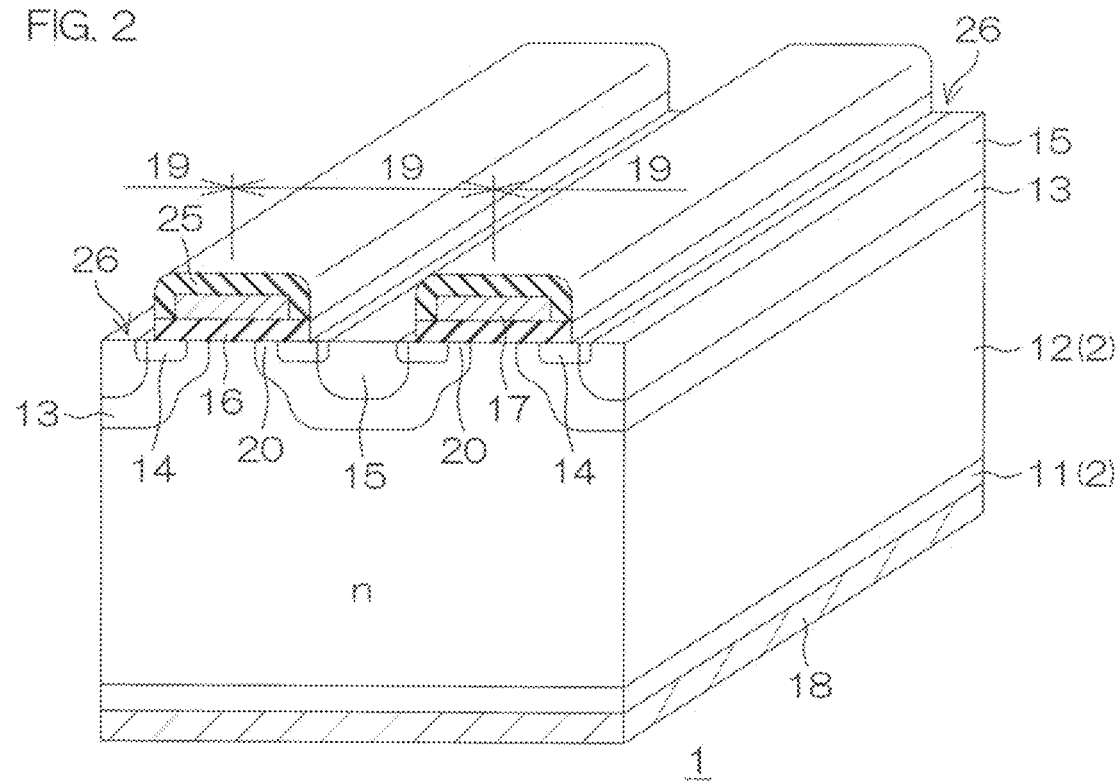
FIG. 2 is a schematic cross-sectional view of the semiconductor device.
Figure 3:
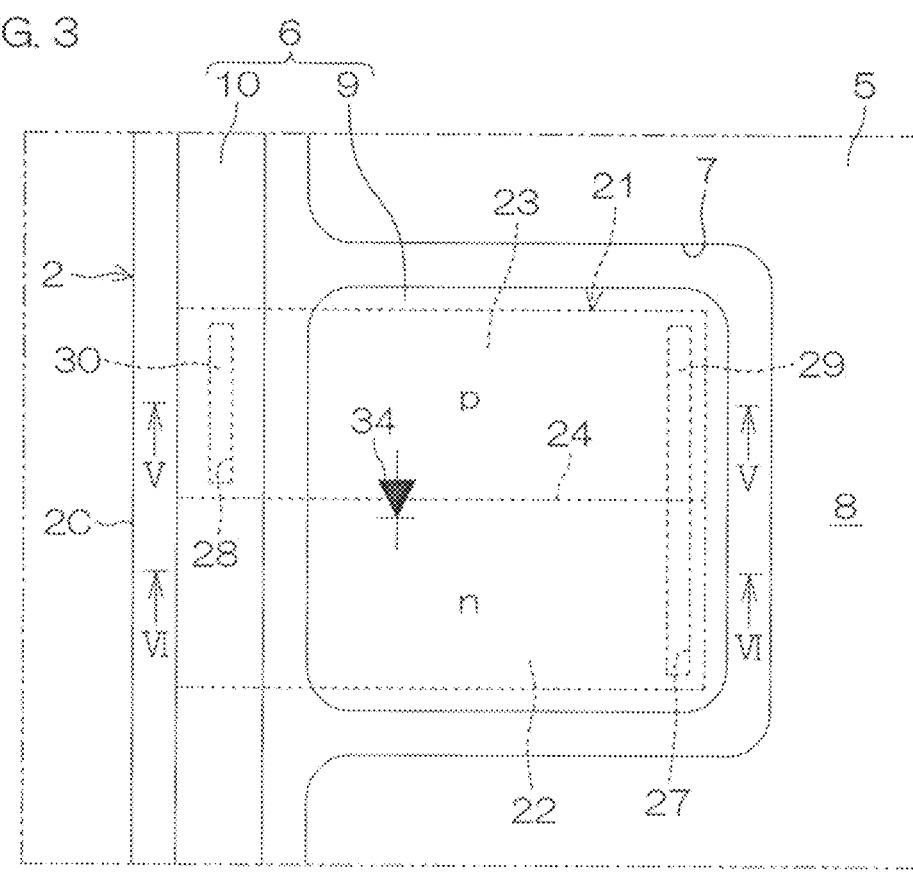
FIG. 3 is an enlarged view of a region surrounded by the alternate long and two short dashes line III of FIG. 1.
Figure 4:
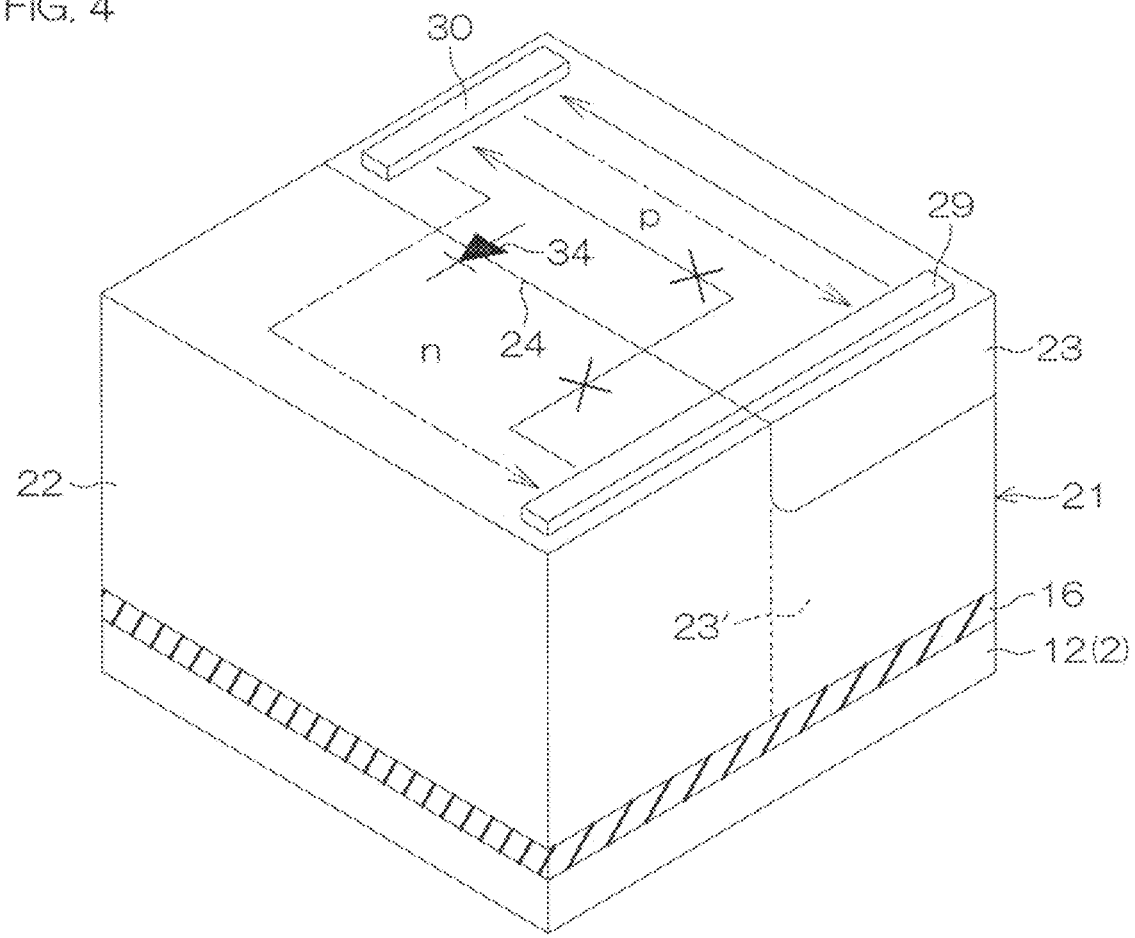
FIG. 4 is a schematic cross-sectional perspective view showing a structure of a portion below a gate pad.

FIG. 2 is a schematic cross-sectional view of the semiconductor device 1. FIG. 3 is an enlarged view of a region surrounded by the alternate long and two short dashes line III of FIG. 1. FIG. 4 is a schematic cross-sectional perspective view showing a structure of a portion below the first conductive film 9. FIG. 5 is a cross-sectional view showing a cross section taken along line V-V of FIG. 3. FIG. 6 is a cross-sectional view showing a cross section taken along line VI-VI of FIG. 3. In FIG. 2, a configuration formed on an interlayer insulating film 25 is omitted. In FIG. 5, with respect to a relay portion 21, only a p type region 23 is shown for convenience, and an n type layer 22 below the p type region 23 is omitted.

In the present preferred embodiment, the semiconductor device 1 is an n-channel type MISFET (Metal Insulator Semiconductor Field Effect Transistor) that is an example of a functional element of the present invention.

The semiconductor device 1 includes an n+ type drain layer 11, an n− type base layer 12, a p type body region 13, an n+ type source region 14, a p+ type body contact region 15, a gate insulating film 16, a gate electrode 17, and a drain electrode 18. The semiconductor substrate 2 of FIG. 1 may be a concept for which the n+ type drain layer 11 and the n− type base layer 12 are combined together.

The n+ type drain layer 11 may be made of an n+ type semiconductor substrate (for example, silicon substrate). Besides, the n+ type drain layer 11 may be a substrate, such as an SiC substrate or a GaN substrate, that is generally employed in transistors. The n+ type semiconductor substrate may be a semiconductor substrate that has undergone crystal growth while being doped with n type impurities. P (phosphorus), As (arsenic), SB (antimony), etc., can be applied as the n type impurities. The impurity concentration of the n+ type drain layer 11 is, for example, about $1.0 \times 10^{18}$ $cm^{-3}$ to $5.0 \times 10^{20}$ $cm^{-3}$. The thickness of the n+ type drain layer 11 is, for example, 1 μm 5 μm.

The n− type base layer 12 is a semiconductor layer into which n type impurities are implanted. More specifically, the n− type base layer 12 may be an n type epitaxial layer that has been epitaxially grown while being implanted with n type impurities on the n+ type drain layer 11. The aforementioned ones can be applied as the n type impurities. The impurity concentration of the n− type base layer 12 is lower than that of the n+ type drain layer 11, and is, for example, about $1.0 \times 10^{10}$ $cm^{-3}$ to $1.0 \times 10^{16}$ $cm^{-3}$. The thickness of the n− type base layer 12 is, for example, 10 μm 50 μm.

The p type body region 13 is a semiconductor layer into which p type impurities are implanted. More specifically, that may be a semiconductor layer formed by performing ion implantation of p type impurities into a surface of the n− type base layer 12. B (boron), Al (aluminum), Ga (gallium), etc., can be applied as the p type impurities. The impurity concentration of the p type body region 13 is, for example, about $1.0 \times 10^{15}$ $cm^{-3}$ to $1.0 \times 10^{19}$ $cm^{-3}$.

The p type body region 13 is selectively formed at a surface portion of the n− type base layer 12. In the present preferred embodiment, a plurality of p type body regions 13 are formed parallel to each other in a striped manner as shown in FIG. 2, and, for example, may extend in a direction along the lateral surfaces 2A and 2C of the semiconductor substrate 2 (see FIG. 1). The plurality of p type body regions 13 may be arranged in a matrix manner in the surface portion of the n− type base layer 12. The width of each of the p type body regions 13 is, for example, 3 μm to 10 μm. A region including each of the p type body regions 13 and the n− type base layer 12 therearound constitutes a unit cell 19. In other words, the semiconductor device 1 has many (a plurality of) unit cells 19 arranged in a striped manner in a plan view in the layout of FIG. 2. Additionally, in FIG. 2, the width (cell pitch) of the adjoining unit cells 19 is, for example, 5 μm to 20 μm.

The n+ type source region 14 is formed in an inward region of the p type body region 13 of each of the unit cells 19. In this region, the n+ type source region 14 is selectively formed at a surface portion of the p type body region 13. The n+ type source region 14 may be formed by selectively performing ion implantation of n type impurities into the p type body region 13. Examples of the n type impurities are as mentioned above. The impurity concentration of the n+ type source region 14 is higher than that of the n− type base layer 12, and is, for example, about $1.0 \times 10^{18}$ $cm^{-3}$ to $5.0 \times 10^{20}$ $cm^{-3}$.

The n+ type source region 14 is formed inside the p type body region 13 so as to be placed at an inward position by a predetermined distance from a circumferential edge of the p type body region 13 (i.e., from an interface between the p type body region 13 and the n− type base layer 12). Hence, in a surface layer region of the semiconductor layer including the n− type base layer 12 and the p type body region 13, etc., the surface portion of the p type body region 13 is interposed between the n+ type source region 14 and the n− type base layer 12, and the surface portion interposed therebetween provides a channel region 20.

In the present preferred embodiment, the n+ type source region 14 is formed in a striped manner. The channel region 20 has a stripe shape in accordance with the shape of the n+ type source region 14.

The p+ type body contact region 15 is selectively formed at the surface portion of the p type body region 13. The p+ type body contact region 15 may be formed by selectively performing ion implantation of p type impurities into the p type body region 13. Examples of the p type impurities are as mentioned above. The impurity concentration of the p+ type body contact region 15 is higher than that of the p type body region 13, and is, for example, about $5.0 \times 10^{17}$ $cm^{-3}$ to $1.0 \times 10^{19}$ $cm^{-3}$.

The p+ type body contact region 15 passes through the n+ type source region 14, and extends toward the n+ type drain layer 11 up to a halfway position of the p type body region 13.

The gate insulating film 16 may be made of, for example, a silicon oxide film, a silicon nitride film, a silicon oxynitride film, a hafnium oxide film, an alumina film, a tantalum oxide film, or the like. Referring to FIG. 2, the gate insulating film 16 is formed so as to cover at least a surface of the p type body region 13 in the channel region 20. In the present preferred embodiment, the gate insulating film 16 is formed so as to cover a part of the n+ type source region 14, the channel region 20, and the surface of the n− type base layer 12. More clearly, the gate insulating film 16 is formed with a pattern that has an opening in the p+ type body contact region 15 of each of the unit cells 19 and an inner edge region of the n+ type source region 14 continuous with the p+ type body contact region 15. Additionally, referring to FIG. 5 and FIG. 6, the gate insulating film 16 is also formed at a portion below the first conductive film 9.

The gate electrode 17 is formed so as to face the channel region 20 with the gate insulating film 16 between the gate electrode 17 and the channel region 20. The gate electrode 17 may be made of, for example, polysilicon whose resistance has been lowered by injecting impurities.

Referring to FIG. 2, in the active portion 3, the gate electrode 17 is formed in substantially the same pattern as that of the gate insulating film 16, and covers a surface of the gate insulating film 16. In other words, the gate electrode 17 is disposed above a part of the n+ type source region 14, the channel region 20, and the surface of the n− type base layer 12. More clearly, the gate electrode 17 is formed with a pattern that has an opening in the p+ type body contact region 15 of each of the unit cells 19 and an inner edge region of the n+ type source region 14 continuous with the p+ type body contact region 15. In other words, the gate electrode 17 is formed so as to control the unit cells 19 in common. Hence, a planar gate structure is formed.

On the other hand, referring to FIG. 3 to FIG. 6, the relay portion 21 is formed on the gate insulating film 16 so as to face the first conductive film 9 and the second conductive film 10. The relay portion 21 relays an electrical connection between the first conductive film 9 and the second conductive film 10.

Referring to FIG. 3, the relay portion 21 is formed so as to straddle the first conductive film 9 and the second conductive film 10 in a portion below the first and second conductive films 9 and 10 (more specifically, between the n− type base layer 12 and each of the first and second conductive films 9 and 10).

Referring to FIG. 4, the relay portion 21 includes an n type layer 22 that is formed in a quadrangular shape in a plan view and that is an example of a second conductivity type region and an example of a second conductivity type layer of the present invention and a p type region 23 that is selectively formed at a surface portion of the n type layer 22 and that is an example of a first conductivity type region of the present invention. Hence, in the relay portion 21, a diode 34 is formed at a boundary portion 24 between the n type layer 22 and the p type region 23 by means of pn junction between the n type layer 22 and the p type region 23.

In the present preferred embodiment, the p type region 23 is formed from one end portion of the n type layer 22 in a direction perpendicular to the lateral surface 2C of the semiconductor substrate 2 in a plan view to the other end portion thereof so as to divide the n type layer 22 into an n type part and a p type part in the perpendicular direction. Hence, the n type layer 22 and the p type region 23 each extend from a region below the first conductive film 9 to a region below the second conductive film 10 so that the boundary portion 24 intersects the first conductive film 9 and the second conductive film 10.

In the present preferred embodiment, the relay portion 21 may be made of the same material (for example, polysilicon) as that of the gate electrode 17. The thickness of the n type layer 22 is, for example, 0.1 μm to 10 μm. On the other hand, the depth of the p type region 23 from the surface of the n type layer 22 is, for example, 0.1 μm to 10 μm. Referring to FIG. 4, the p type region 23 is selectively formed at the surface portion of the n type layer 22, and the n type part of the n type layer 22 comes around below the p type region 23, and this n type part is disposed between the p type region 23 and the gate insulating film 16 in the present preferred embodiment. However, the range of the p type region 23 is not limited to this, and the p type region 23 may be formed over the entirety in the depth direction of the n type layer 22 from the surface of the n type layer 22 to the gate insulating film 16, for example, as shown by the broken line 23' in FIG. 4.

The impurity concentration of the n type layer 22 is, for example, $1.0 \times 10^{19}$ cm$^{-3}$ to $1.0 \times 10^{21}$ cm$^{-3}$. The impurity concentration of the p type region 23 is, for example, $1.0 \times 10^{19}$ cm$^{-3}$ to $1.0 \times 10^{21}$ cm$^{-3}$. Examples of both the n type impurities and the p type impurities are as mentioned above.

An interlayer insulating film 25 is formed on the n− type base layer 12 so as to cover the gate electrode 17 and the relay portion 21. The interlayer insulating film 25 is made of an insulating material, such as a silicon oxide film, a silicon nitride film, or TEOS (tetraethoxysilane).

Referring to FIG. 2, a contact hole 26 by which the p+ type body contact region 15 and the n+ type source region 14 of each of the unit cells 19 are exposed is formed in the interlayer insulating film 25. The contact hole 26 is formed so as to penetrate through the interlayer insulating film 25 and the gate insulating film 16.

Referring to FIG. 3, FIG. 5, and FIG. 6, a contact hole 27 by which an inner end portion of the relay portion 21 in the direction perpendicular to the lateral surface 2C of the semiconductor substrate 2 is exposed and a contact hole 28 by which an outer end portion on the side opposite to the inner end portion is exposed are formed in the interlayer insulating film 25. The contact hole 27 is formed so as to straddle the boundary portion 24 between the n type layer 22 and the p type region 23, and exposes both the n type layer 22 and the p type region 23. On the other hand, the contact hole 28 exposes only one of the n type layer 22 and the p type region 23 (in the present preferred embodiment, only the p type region 23).

The source electrode film 5 is made of aluminum or other metals. The source electrode film 5 is formed so as to selectively cover a surface of the interlayer insulating film 25 and so as to be embedded in the contact hole 26. Hence, the source electrode film 5 is ohmically connected to the n+ type source region 14. Therefore, the source electrode film 5 is connected to the unit cells 19 in parallel, and is arranged so that an entire current which flows to the unit cells 19 flows. Additionally, the source electrode film 5 is ohmically connected to the p+ type body contact region 15 of each of the unit cells 19 through the contact hole 26, and stabilizes the electric potential of the p type body region 13.

The gate electrode film 6 is made of aluminum or other metals. Referring to FIG. 3 to FIG. 6, the first conductive film 9 is formed so as to selectively cover the surface of the interlayer insulating film 25 and so as to be embedded in the contact hole 27. Hence, the first conductive film 9 is electrically connected to both the n type layer 22 and the p type region 23. In other words, the part of the first conductive film 9 which has been embedded in the contact hole 27 straddles both the n type layer 22 and the p type region 23 so as to serve as a first contact 29, and is electrically connected to the n type layer 22 and the p type region 23. On the other hand, referring to FIG. 3 to FIG. 6, the second conductive film 10 is formed so as to selectively cover the surface of the interlayer insulating film 25 and so as to be embedded in the contact hole 28. Hence, the second conductive film 10 is electrically connected to only the p type region 23, and is physically insulated from the n type layer 22. In other words, the part of the second conductive film 10 which has been embedded in the contact hole 28 is electrically connected to only the p type region 23 so as to serve as a second contact 30.

Although the first contact 29 and the second contact 30 are formed by using the same materials integrally with the first conductive film 9 and the second conductive film 10, respectively, in the present preferred embodiment, the first contact 29 and the second contact 30 may be made of different materials. For example, titanium, titanium nitride, tungsten, etc., can be used as other materials for the first contact 29 and the second contact 30.

The surface insulating film 31 is formed on a topmost surface of the semiconductor substrate 2 so as to cover the source electrode film 5 and the gate electrode film 6. The surface insulating film 31 is made of an insulating material, such as a silicon nitride film or a polyimide film. Referring to FIG. 5 and FIG. 6, a pad opening 33 by which a part of the first conductive film 9 is exposed as a gate pad 32 is formed in the surface insulating film 31. A pad opening (not shown) by which a part of the source electrode film 5 is exposed as the source pad 8 is formed in the surface insulating film 31.

The drain electrode 18 is made of aluminum or other metals. The drain electrode 18 is formed so as to come into contact with a rear surface of the n+ type drain layer 11. Hence, the drain electrode 18 is connected to the unit cells 19 in parallel, and is arranged so that an entire current which flows to the unit cells 19 flows.

Figure 7:
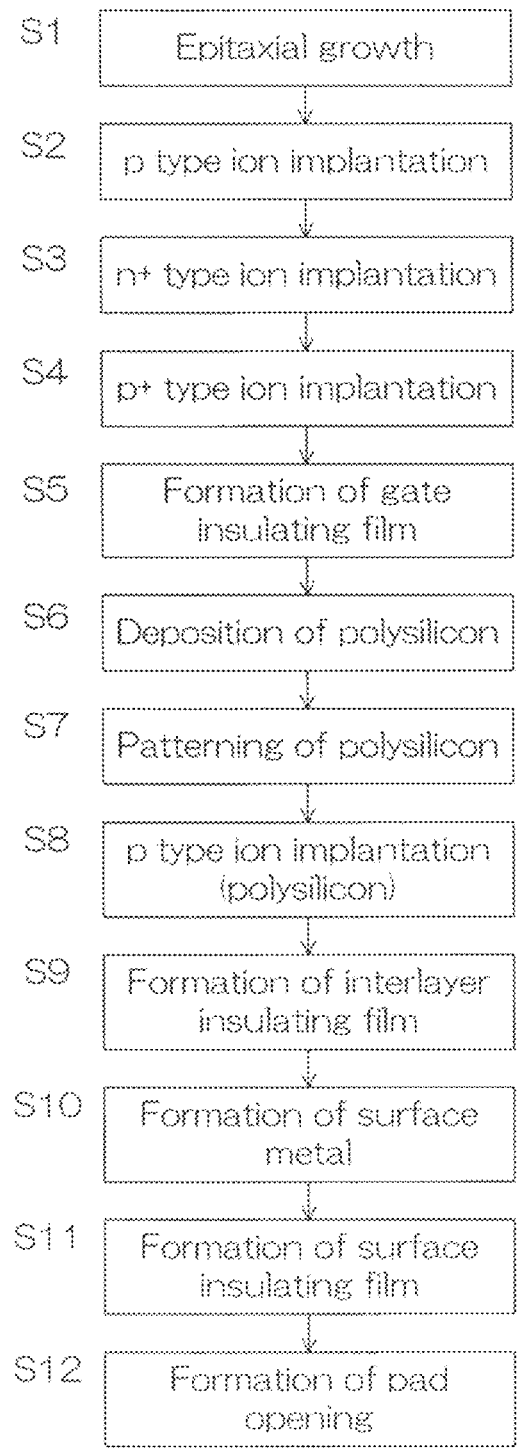
FIG. 7 is a flowchart showing a part of a process of manufacturing the semiconductor device.

Next, a method of manufacturing the semiconductor device 1 will be described with reference to FIG. 7.

To manufacture the semiconductor device 1, the n− type base layer 12 is formed on the n+ type drain layer 11, for example, by means of epitaxial growth (S1).

Thereafter, p type ions are selectively implanted into the surface of the n− type base layer 12, and annealing treatment (1000° C. to 1200° C.) is performed, and, as a result, the p type body region 13 is formed (S2).

Thereafter, n type ions are selectively implanted into the surface of the p type body region 13, and annealing treatment (1000° C. to 1200° C.) is performed, and, as a result, the n+ type source region 14 is formed (S3).

Thereafter, p type ions are selectively implanted into the surface of the p type body region 13, and annealing treatment (1000° C. to 1200° C.) is performed, and, as a result, the p+ type body contact region 15 is formed (S4).

Thereafter, the gate insulating film 16 is formed on the n− type base layer 12 (S5). The gate insulating film 16 may be formed by thermal oxidation of a semiconductor crystal surface.

Thereafter, a material for the gate electrode 17 and for the relay portion 21 (in the present preferred embodiment, polysilicon) is deposited on the n− type base layer 12 while adding impurities (in the present preferred embodiment, n type impurities) (S6), and then a polysilicon layer deposited thereon is subjected to patterning (S7). Hence, the gate electrode 17 and the relay portion 21 (n type layer 22) are simultaneously formed.

Thereafter, p type ions are selectively implanted into the relay portion 21 (n type layer 22) through a mask (S8). Hence, the p type region 23 is formed at the surface portion of the n type layer 22.

Thereafter, the interlayer insulating film 25 is formed so as to cover the gate electrode 17 and the relay portion 21 (S9), and the contact holes 26 to 28 are formed in the interlayer insulating film 25 by means of photolithography.

Thereafter, the source electrode film 5 and the gate electrode film 6 are each formed on the interlayer insulating film 25 as a surface metal (S10).

Thereafter, the surface insulating film 31 is formed so as to cover the source electrode film 5 and the gate electrode film 6 (S11), and the pad opening 33 is formed in the surface insulating film 31 by means of photolithography (S12).

Thereafter, the drain electrode 18 is formed on the rear surface of the n+ type drain layer 11, thus making it possible to obtain the semiconductor device 1 mentioned above.

In the semiconductor device 1, a reverse bias is applied to a pn junction portion (parasitic diode) between the p type body region 13 and the n− type base layer 12 when a power source is connected between the source electrode film 5 and the drain electrode 18 under the condition that the drain electrode 18 is set as a high potential side whereas the source electrode film 5 is set as a low potential side. At this time, if a control voltage lower than a predetermined threshold voltage is applied to the gate electrode 17, no current path is created in the drain-to-source space. In other words, the semiconductor device 1 reaches an OFF state. On the other hand, if a control voltage equal to or more than the threshold voltage is applied to the gate electrode 17, electrons are attracted to a surface of the channel region 20, and an inversion layer (channel) is formed. Hence, an electrically conductive state is reached between the n+ type source region 14 and the n− type base layer 12. In other words, a current path is created that reaches the drain electrode 18 from the source electrode film 5 through the n+ type source region 14, the inversion layer of the channel region 20, and the n− type base layer 12 in this order. In other words, the semiconductor device 1 reaches an ON state.

In the thus-performed on-off operation, when a voltage is applied from the gate pad 32 to the gate electrode, ringing easily occurs when it is turned on, whereas ringing does not easily occur when it is turned off, and therefore it is preferable to reduce only the noise that is made when it is turned on.

Therefore, in the semiconductor device 1, the relay portion 21 is provided, and the first conductive film 9 (gate pad) is connected to both the p type region 23 and the n type layer 22 through the first contact 29, and the second conductive film 10 (gate finger) is connected to only the p type region 23 through the second contact 30.

When a positive voltage with respect to the second conductive film 10 is applied to the first conductive film 9, the flow of an electric current between the first conductive film 9 and the second conductive film 10 takes a direction from the first conductive film 9 toward the second conductive film 10. In this case, a reverse current will flow through the diode 34. Therefore, the current path is limited to the path of (1) the first conductive film 9→the first contact 29→the p type region 23→the second contact 30→the second conductive film 10, and an electric current does not flow or hardly flows to the path of (2) the first conductive film 9→the first contact 29→the n type layer 22→the diode 34→the p type region 23→the second contact 30→the second conductive film 10 as shown in FIG. 4 (solid line arrows) and FIG. 8.

On the other hand, when a positive voltage with respect to the first conductive film 9 is applied to the second conductive film 10, the flow of an electric current between the first conductive film 9 and the second conductive film 10 takes a direction from the second conductive film 10 toward the first conductive film 9. In this case, a forward current will flow through the diode 34. Therefore, it is possible to use two paths in total as current paths, i.e., it is possible to use the path of (3) the second conductive film 10→the second contact 30→the p type region 23→the first contact 29→the first conductive film 9 and the path of (4) the second conductive film 10→the second contact 30, the p type region 23→the diode 34→the n type layer 22→the first contact 29→the first conductive film 9 as shown in FIG. 4 (alternate long and short dash line arrows) and FIG. 9.

In other words, when it is turned on, the number of current paths is one, hence making it possible to relatively heighten resistance, and when it is turned off, the number of current paths is two, hence making it possible to relatively make resistance lower than that when turned on. As thus described, the number of paths of gate current that flows when the MISFET is turned on differs from the number of paths of gate current that flows when the MISFET is turned off, and the resistance when the MISFET is turned on differs from the resistance when the MISFET is turned off. Therefore, it is possible to appropriately control the behavior of a gate current when the MISFET is turned on/off. Moreover, it is possible to perform such current control inside the semiconductor device 1, and therefore it is also possible to maintain the space efficiency when the semiconductor device 1 is mounted.

Thereafter, in the structure of FIG. 4, I-V characteristics of the gate electrode were examined by simulations when a positive voltage (30 V, pn→p) was applied to the first contact 29 and when a positive voltage (30 V, p→pn) was applied to the second contact 30 between the first contact 29 (pn) and the second contact 30 (p). FIG. 10 is a diagram showing I-V characteristics when it is turned on, and FIG. 11 is a diagram showing I-V characteristics when it is turned off. From a comparison between FIG. 10 and FIG. 11, it has been understood that the rise of an electric current when it is turned on is smoother than that when turned off and that there is a great difference in electric resistance between when it is turned on and turned off.

Although the preferred embodiment of the present invention has been described as above, the present invention can be embodied in other modes.

Figure 12:
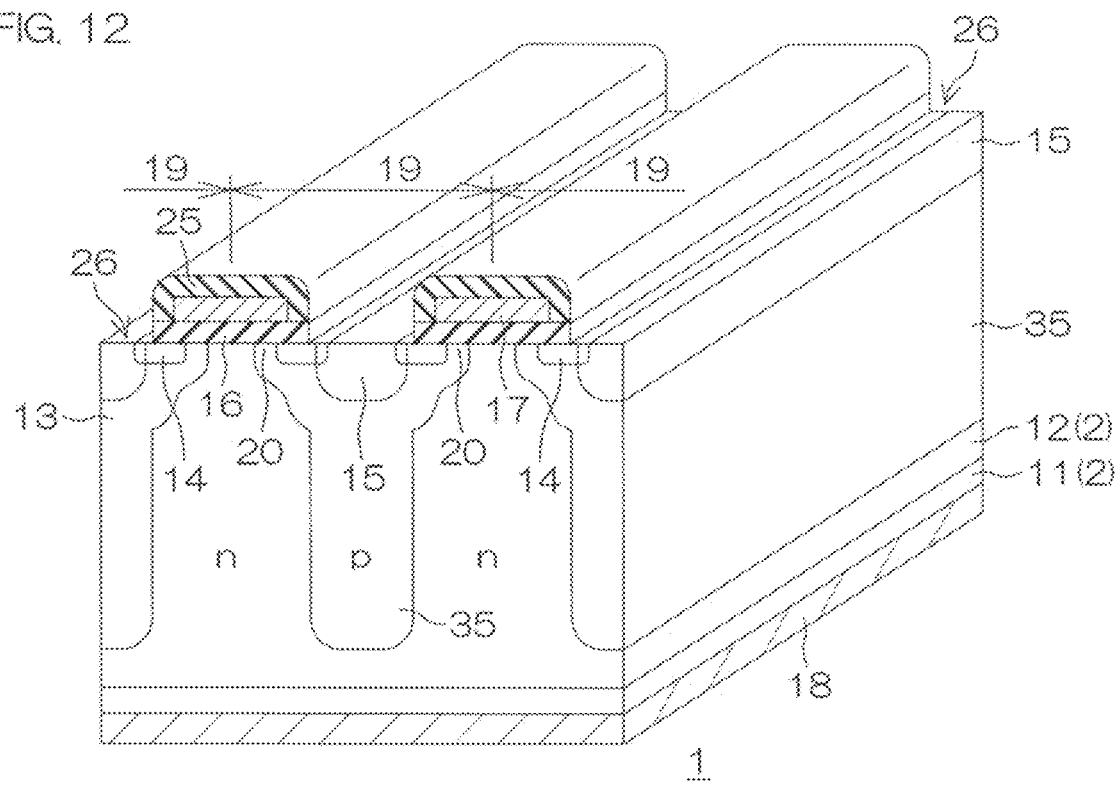
FIG. 12 is a view showing a modification of the semiconductor device.
Figure 13:
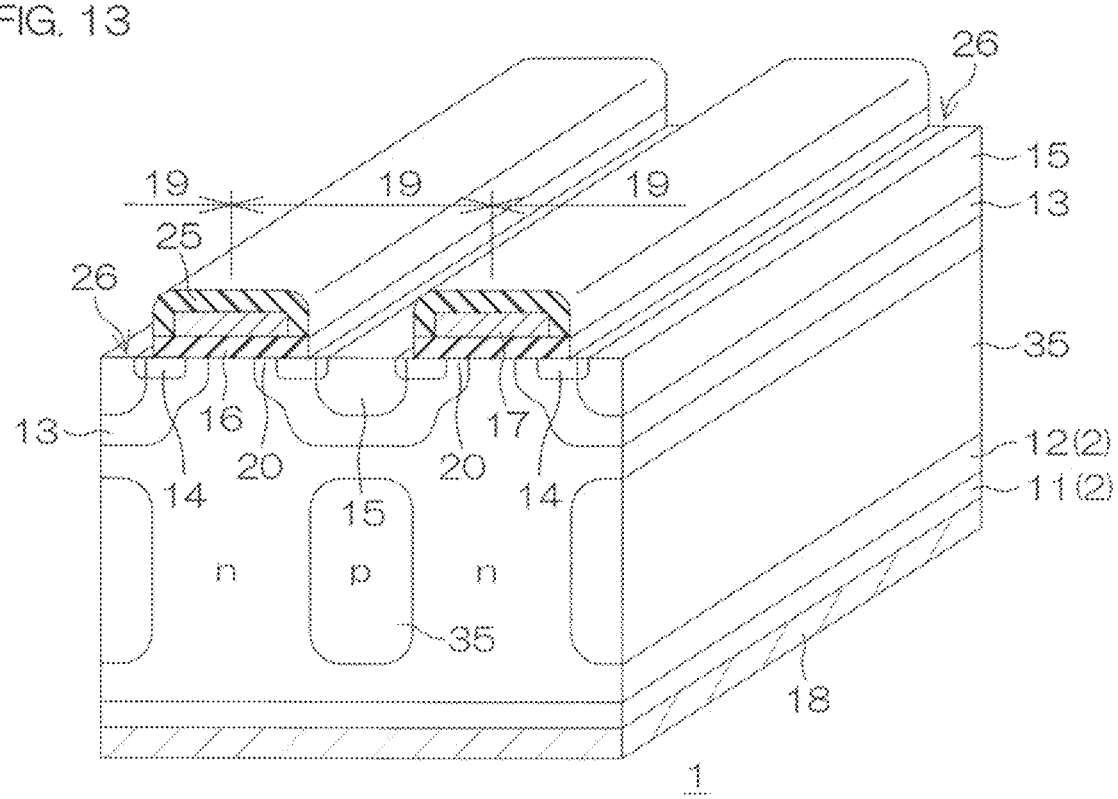
FIG. 13 is a view showing a modification of the semiconductor device.

For example, referring to FIG. 12, the semiconductor device 1 may have a super-junction structure including a p type column layer 35 formed at a portion below the p type body region 13. In this case, the p type column layer 35 may be formed so as to be continuous with the p type body region 13 as shown in FIG. 12, or may be disposed in such a manner as to be separated from the p type body region 13 as shown in FIG. 13.

Figure 14:
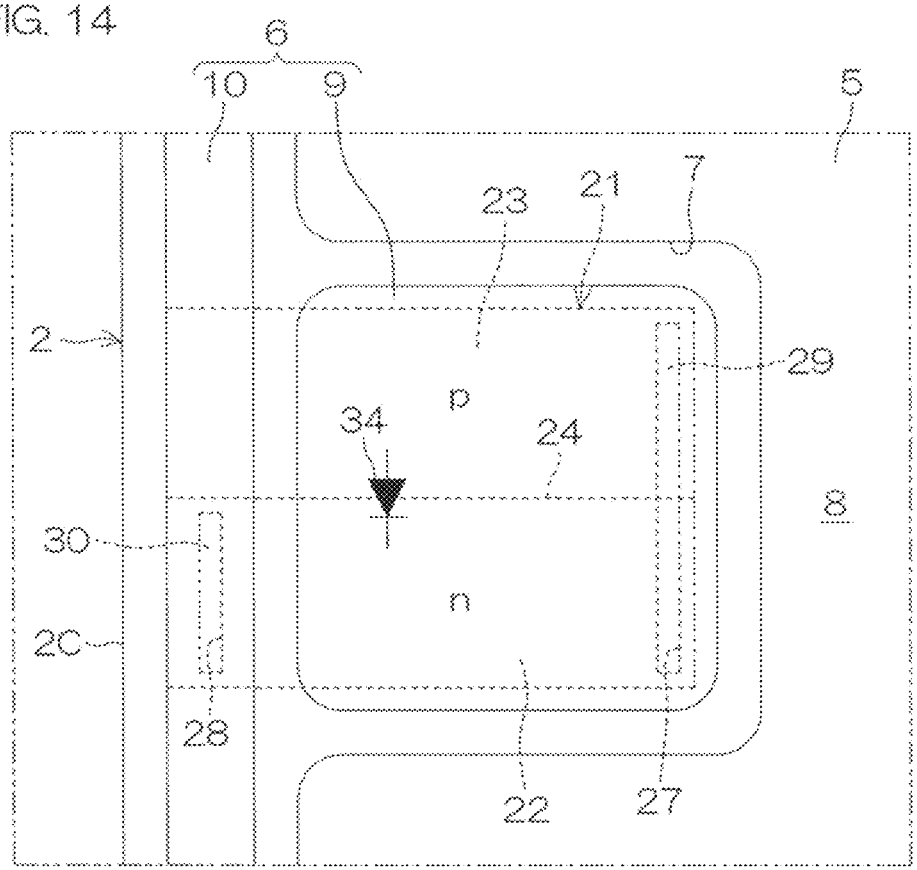
FIG. 14 is a view showing a modification of the semiconductor device.

Additionally, the second contact 30 is electrically connected to only the p type region 23 as described in the above preferred embodiment. The reason is that it is preferable to reduce only the noise caused when it is turned on because, with respect to a gate current, ringing easily occurs when it is turned on, whereas ringing does not easily occur when it is turned off. However, if there is an intention to relatively lower resistance when it is turned on and to relatively heighten resistance when it is turned off without being limited to the gate current, the second contact 30 may be electrically connected to only the n type layer 22 as shown in FIG. 14.

Additionally, although the relay portion 21 is disposed at a portion below the first and second conductive films 9 and 10 as described in the above preferred embodiment, the relay portion 21 may be formed so as to straddle the first conductive film 9 and the second conductive film 10 above the first and second conductive films 9 and 10.

Additionally, the relay portion 21 can also be made of, for example, aluminum, copper, or the like without being limited to polysilicon.

Additionally, the structure of the unit cells 19 may be a planar gate structure as described in the above preferred embodiment, or may be a trench gate structure.

Additionally, a configuration in which the conductivity type of each semiconductor part of the semiconductor device 1 is reversed may be employed. For example, in the semiconductor device 1, the p type part may be an n type, and the n type part may be a p type.

Besides, various design changes can be made within the scope of the matters described in the appended claims.

This application corresponds to Japanese Patent Application No. 2018-64795 filed with the Japan Patent Office on Mar. 29, 2018, the entire disclosure of which is incorporated herein by reference.

EXAMPLES

Next, the present invention will be described on the basis of examples, and yet the present invention is not restricted by the following examples.

Examples 1 to 7

Figure 15:
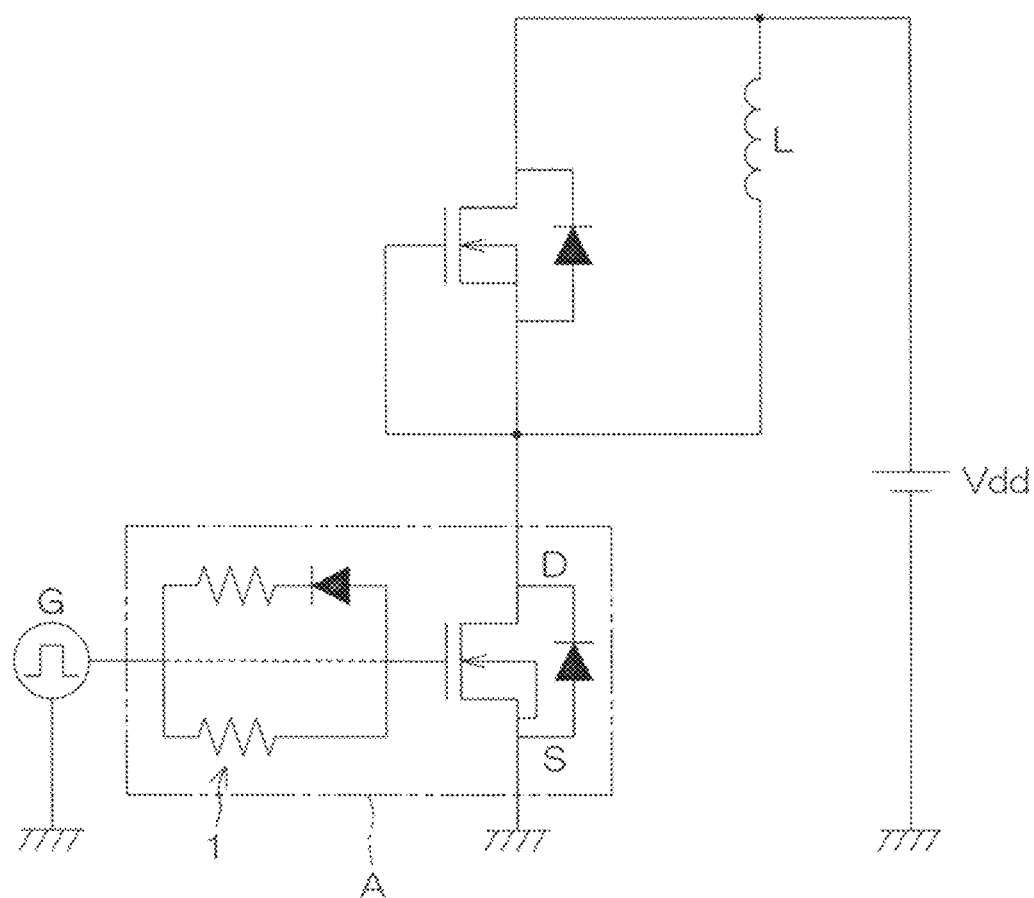
FIG. 15 is a measurement circuit diagram used in examples.

First, a measurement circuit of a semiconductor device of each of Examples 1 to 7 is as shown in FIG. 15. In FIG. 15, a part surrounded by the alternate long and two short dashes line A corresponds to the aforementioned semiconductor device 1.

Next, the structure of a relay portion 39 in semiconductor devices of Examples 1 to 7 will be concretely described with reference to FIG. 16 to FIG. 22. FIG. 16 is Example 1 (pattern A), FIG. 17 is Example 2 (pattern B), FIG. 18 is Example 3 (pattern C), FIG. 19 is Example 4 (pattern D), FIG. 20 is Example 5 (pattern E), FIG. 21 is Example 6 (pattern F), and FIG. 22 is Example 7 (pattern G).

Unlike the aforementioned relay portion 21, the relay portion 39 is made of a polysilicon layer, which is common in the semiconductor devices of Examples 1 to 7. The relay portion 39 is composed of an n type layer 36 and a p type layer 37 that adjoins the n type layer 36 and that is contiguous to the n type layer 36. Additionally, in the relay portion 39, a slit 38 that partially separates the n type layer 36 and the p type layer 37 from each other is formed on an extension line of the boundary portion 24 between the n type layer 36 and the p type layer 37.

The relay portion 39 having the thus-formed structure can be manufactured as follows. First, a material (polysilicon) for the gate electrode 17 and a material (polysilicon) for the relay portion 39 are deposited on the n− type base layer 12 in the manner of step S6 of FIG. 7. Thereafter, p type ions (boron) are implanted into the entire surface of the polysilicon layer to turn the polysilicon layer into a p type. Thereafter, the polysilicon layer is subjected to patterning in the manner of step S7 of FIG. 7. Hence, the gate electrode 17 and the relay portion 39 are simultaneously formed.

Thereafter, p type ions (boron) are again implanted into the relay portion 39 when the p type body region 13 is formed. Thereafter, n type ions (arsenic) are implanted in a state in which the polysilicon layer is selectively covered with a mask (resist) when the n+ type source region 14 is formed. Hence, the n type layer 36 is formed at the relay portion 39, and the p type layer 37 is also formed at the part covered with the mask. Thereafter, apart of the relay portion 39 is removed, and, as a result, the slit 38 is formed.

Unlike the aforementioned preferred embodiment, the contact hole 27 is divided into a one-side contact hole 27A by which the p type layer 37 is exposed and an opposite-side contact hole 27B by which the n type layer 36 is exposed in the semiconductor devices of Examples 1 to 7. Additionally, the first contact 29 is divided into a one-side first contact 29A connected to the p type layer 37 through the one-side contact hole 27A and an opposite-side first contact 29B connected to the n type layer 36 through the opposite-side contact hole 27B. In other words, the one-side first contact 29A and the opposite-side first contact 29B are formed so as to be independent of each other.

The semiconductor devices of Examples 1 to 7 that have been structured as above were incorporated into the circuit of FIG. 15, and time-dependent changes in electric current caused when the gate voltage is turned on/off were verified. Results are shown in FIGS. 23 to 25. The term "Ref" shown in FIG. 23 to FIG. 25 denotes a structure in which the first conductive film 9 and the second conductive film 10 are short-circuited without providing the relay portion 39. Additionally, the pattern is changed on the basis of Example 2 in the following description.

First, Examples 1 to 3 are compared with each other in FIG. 23. A difference among pattern A, pattern B, and pattern C is the size of the area of the p type layer 37 as shown in FIG. 16 to FIG. 18 (the position of the one-side first contact 29A and the position of the opposite-side first contact 29B are fixed). Hence, resistance values of the p type layer 37 differ from each other between the one-side first contact 29A and the second contact 30.

It was confirmed how the drain current changes in accordance with the difference in area of the p type layer 37 when the gate voltage is turned on/off. As a result, when the gate voltage was turned on, ringing (near −0.7 µs, near 0.5 µs) was suppressed compared with Ref in all of Examples 1 to 3. On the other hand, when the gate voltage was turned off, the discharging rate was substantially equal to that of Ref because the number of current paths becomes two as shown by the alternate long and short dash line arrows of FIG. 4.

Next, Examples 2, 4, and 5 are compared with each other in FIG. 24. A difference among pattern B, pattern D, and pattern E is the position of the opposite-side first contact 29B as shown in FIG. 17, FIG. 19, and FIG. 20 (the size of the area of the p type layer 37 and the position of the one-side first contact 29A are fixed). Hence, resistance values of the n type layer 36 differ from each other between the opposite-side first contact 29B and the second contact 30.

It was confirmed how the drain current changes in accordance with the difference in position of the opposite-side first contact 29B when the gate voltage is turned on/off. As a result, when the gate voltage was turned on, ringing (near −0.7 µs, near 0.5 µs) was suppressed compared with Ref in both of Examples 4 and 5. On the other hand, when the gate voltage was turned off, the discharging rate was substantially equal to that of Ref because the number of current paths becomes two as shown by the alternate long and short dash line arrows of FIG. 4.

Next, Examples 2, 6, and 7 are compared with each other in FIG. 25. A difference among pattern B, pattern F, and pattern G is the position of the one-side first contact 29A as shown in FIG. 17, FIG. 21, and FIG. 22 (the size of the area of the p type layer 37 and the position of the opposite-side first contact 29B are fixed). Hence, resistance values of the p type layer 37 differ from each other between the one-side first contact 29A and the second contact 30.

It was confirmed how the drain current changes in accordance with the difference in position of the one-side first contact 29A when the gate voltage is turned on/off. As a result, when the gate voltage was turned on, ringing (near −0.7 µs, near 0.5 µs) was suppressed compared with Ref in both of Examples 6 and 7. On the other hand, when the gate voltage was turned off, the discharging rate was substantially equal to that of Ref because the number of current paths becomes two as shown by the alternate long and short dash line arrows of FIG. 4.

As described above, ringing was suppressed compared with Ref in all of Examples 1 to 7 when the gate voltage was turned on.

On the other hand, a great change in characteristics was found in accordance with a change in position of the one-side first contact 29A as shown in FIG. 25. In other words, the discharging rate became slower in proportion to an approach of the one-side first contact 29A to the second contact 30. On the other hand, a great change in characteristics was not produced with a change in area size of the p type layer 37 and with a change in position of the opposite-side first contact 29B. Therefore, it has been understood that it is recommended to change the position of the one-side first contact 29A if there is an intention to greatly change characteristics, and it is recommended to change the size of the area of the p type layer 37 or change the position of the opposite-side first contact 29B if there is an intention to finely adjust characteristics.

Examples 8 and 9

Next, structures of relay portions 40 and 41 in semiconductor devices of Examples 8 and 9 will be concretely described with reference to FIG. 26 and FIG. 27. FIG. 26 is Example 8 (pattern H), and FIG. 27 is Example 9 (pattern I).

In Example 8, the relay portion 40 is composed of two polysilicon layers 42 and 43. The polysilicon layer 42, which is one of the two polysilicon layers, is formed as a p type layer in its entirety. The polysilicon layer 42 is connected to the one-side first contact 29A and to the one-side second contact 30A. The polysilicon layer 43, which is the other one of the two polysilicon layers, is partitioned into an n type layer 44 and a p type layer 45. The p type layer 45 is connected to the opposite-side second contact 30B, and the n type layer 44 is connected to the opposite-side first contact 29B.

In Example 9, the relay portion 41 includes an n type layer 46 and a p type layer 47. The n type layer 46 straddles the first conductive film 9 and the second conductive film 10 below the first conductive film 9 and the second conductive film 10. The p type layer 47 surrounds the n type layer 46, and is contiguous to the n type layer 46. The p type layer 47 is connected to the one-side first contact 29A and to the second contact 30. The n type layer 46 is connected to the opposite-side first contact 29B.

Likewise, in Examples 8 and 9, verification was conducted by use of the aforementioned measurement circuit of FIG. 15, and, as a result, ringing was suppressed compared with Ref when the gate voltage was turned on in the same way as in Examples 1 to 7 (not shown).

REFERENCE SIGNS LIST

1 Semiconductor device
2 Semiconductor substrate
3 Active region
4 Outer peripheral portion
6 Gate electrode film
9 First conductive film
10 Second conductive film
11 N+ type drain layer
12 N− type base layer
13 P type body region
14 N+ type source region
16 Gate insulating film
17 Gate electrode
19 Unit cell
21 Relay portion
22 N type layer
23 P type region
24 Boundary portion
29 First contact
29A One-side first contact
29B Opposite-side first contact
30 Second contact
31 Surface insulating film
34 Diode 36 N type layer
37 P type layer
38 Slit
39 Relay portion
40 Relay portion
41 Relay portion
42 Polysilicon layer
43 Polysilicon layer
44 N type layer
45 P type layer
46 N type layer
47 P type layer

The invention claimed is:

1. A semiconductor device comprising:
a semiconductor layer;
a first conductor disposed on the semiconductor layer;
a second conductor disposed on the semiconductor layer so as to be separated from the first conductor;
a relay portion that is formed on the semiconductor layer so as to straddle the first conductor and the second conductor and that is made of a semiconductor having a first conductivity type region and a second conductivity type region;
a first contact by which the relay portion is electrically connected to the first conductor; and
a second contact that electrically connects the relay portion and the second conductor together, wherein
a first current path formed in the relay portion when a positive voltage with respect to the first conductor is applied to the second conductor has relatively lower resistance than a second current path formed in the relay portion when a positive voltage with respect to the second conductor is applied to the first conductor, and
the relay portion is disposed closer to the semiconductor layer than a gate pad and a gate wiring.

2. The semiconductor device according to claim 1, further comprising a functional element formed at the semiconductor layer, wherein
the first conductor includes an external terminal to which electric power is supplied from outside, and
the second conductor includes a wiring that supplies electric power supplied to the first conductor to the functional element.

3. The semiconductor device according to claim 2, wherein
the functional element is an element including a gate electrode that controls an electric current that flows to the functional element, and
the external terminal includes the gate pad, to which an electroconductive bonding member is bonded from outside, and
the wiring includes the gate wiring, that supplies electric power supplied to the gate pad to the gate electrode,
the first conductivity type region is a p type region, and the second conductivity type region is an n type region.

4. The semiconductor device according to claim 3, wherein the gate wiring includes a gate finger disposed at an outer peripheral portion of the semiconductor layer so as to surround the functional element.

5. The semiconductor device according to claim 3, wherein the functional element includes a field-effect transistor that has a body region selectively formed at a surface portion of the semiconductor layer, a source region formed at an inner portion of the body region, and the gate electrode facing a part of the body region through a gate insulating film.

6. The semiconductor device according to claim 5, wherein the body region includes a plurality of body regions that extend in a striped manner with intervals from each other.

7. The semiconductor device according to claim 1, wherein the relay portion includes a second conductivity type layer as the second conductivity type region and the first conductivity type region selectively formed at a surface portion of the second conductivity type layer.

8. The semiconductor device according to claim 7, wherein a thickness of the second conductivity type layer is 0.1 μm to 10 μm, and
a depth of the first conductivity type region from a surface of the second conductivity type layer is 0.1 μm to 10 μm.

9. The semiconductor device according to claim 1, wherein the relay portion includes a second conductivity type layer as the second conductivity type region and a first conductivity type layer as the first conductivity type region, the first conductivity type layer adjoining the second conductivity type layer and being contiguous to the second conductivity type layer.

10. The semiconductor device according to claim 9, further comprising a slit that is formed on an extension line of a boundary portion between the second conductivity type layer and the first conductivity type layer and by which the second conductivity type layer and the first conductivity type layer are partially separated from each other.

11. The semiconductor device according to claim 1, wherein the first contact is formed so as to straddle the first conductivity type region and the second conductivity type region of the relay portion.

12. The semiconductor device according to claim 1, wherein the first contact includes a one-side first contact that is connected to the first conductivity type region of the relay portion and an opposite-side first contact that is apart from the one-side first contact and that is connected to the second conductivity type region of the relay portion.

13. The semiconductor device according to claim 1, wherein an impurity concentration of the first conductivity type region is $1.0 \times 10^{19}$ cm$^{-3}$ to $1.0 \times 10^{21}$ cm$^{-3}$, and
an impurity concentration of the second conductivity type region is $1.0 \times 10^{19}$ cm$^{-3}$ to $1.0 \times 10^{21}$ cm$^{-3}$.

14. The semiconductor device according to claim 1, wherein the first conductor and the second conductor are each made of aluminum, and
the relay portion is made of polysilicon.

15. The semiconductor device according to claim 1, wherein the semiconductor layer includes a silicon substrate.

16. The semiconductor device according to claim 1, wherein the second conductor is formed in a linear shape along a side surface of the semiconductor layer.

17. The semiconductor device according to claim 1, wherein one of sides of the first conductor is disposed along a side surface of the semiconductor layer and faces the second conductor.

* * * * *